United States Patent [19]
Choi et al.

[11] Patent Number: 6,043,129
[45] Date of Patent: Mar. 28, 2000

[54] HIGH DENSITY MOSFET WITH RAISED SOURCE AND DRAIN REGIONS

[75] Inventors: Jeong Yeol Choi, Palo Alto; Chung-Chyung Han; Ken-Chuen Mui, both of San Jose, all of Calif.

[73] Assignee: Integrated Device Technology, Inc., Santa Clara, Calif.

[21] Appl. No.: 08/876,540

[22] Filed: Jun. 9, 1997

[51] Int. Cl.[7] .................................................. H01L 21/336
[52] U.S. Cl. ......................... 438/300; 438/301; 438/303
[58] Field of Search ................................... 438/299, 300, 438/301, 302, 303, 304, 305, 306, 307, 154, 213, 218

[56] References Cited

U.S. PATENT DOCUMENTS

| | | | |
|---|---|---|---|
| 4,016,587 | 4/1977 | De La Moneda | 357/23 |
| 4,072,545 | 2/1978 | De La Moneda | 148/187 |
| 4,841,347 | 6/1989 | Hsu . | |
| 4,849,369 | 7/1989 | Jeuch et al. . | |
| 5,168,072 | 12/1992 | Moslehi . | |
| 5,182,619 | 1/1993 | Pfiester | 257/382 |
| 5,242,847 | 9/1993 | Ozturk et al. . | |
| 5,340,758 | 8/1994 | Wei et al. | 437/40 |
| 5,371,026 | 12/1994 | Hayden et al. | 438/275 |
| 5,376,578 | 12/1994 | Hsu et al. | 437/56 |
| 5,418,173 | 5/1995 | Lee et al. . | |
| 5,504,031 | 4/1996 | Hsu et al. | 437/57 |
| 5,654,240 | 8/1997 | Lee et al. . | |
| 5,683,924 | 11/1997 | Chan et al. | 437/44 |
| 5,691,212 | 11/1997 | Tsai et al. | 437/24 |
| 5,736,419 | 4/1998 | Naem | 438/300 |
| 5,773,358 | 6/1998 | Wu et al. | 438/564 |
| 5,777,920 | 7/1998 | Ishigaki et al. | 365/154 |
| 5,804,472 | 7/1998 | Balasinski et al. | 438/158 |

*Primary Examiner*—John F. Niebling
*Assistant Examiner*—John Murphy
*Attorney, Agent, or Firm*—Skjerven, Morrill, MacPherson, Franklin & Friel

[57] ABSTRACT

A semiconductor substrate having a surface, a planarized field oxide region at the surface and a gate structure overlying the surface are provided. A sidewall spacer is formed adjacent to the gate structure and a polysilicon layer is formed overlying the substrate, the polysilicon layer having a raised first portion overlying the gate structure. A masking layer is formed overlying the polysilicon layer and then blanket etched to expose the raised first portion of the polysilicon layer which is subsequently removed. Since the raised first portion of the polysilicon layer is removed without using photolithography, high density MOSFETs are readily fabricated.

57 Claims, 11 Drawing Sheets

HIGH DENSITY MOSFET WITH RAISED SOURCE AND DRAIN REGIONS

BACKGROUND OF THE INVENTION

1. Field of the Invention

The present invention relates in general to integrated semiconductor devices and more particularly to the fabrication of metal oxide semiconductor field effect transistors with raised source and drain regions and the resulting structure.

2. Description of the Prior Art

As metal oxide semiconductor field effect transistors (MOSFETs) are scaled down to have feature sizes below 0.5 microns ($\mu$m), several device characteristics become increasingly important.

One important characteristic is the punchthrough voltage between the source and drain, i.e. the source/drain voltage at which conduction between the source and drain (punchthrough) occurs when the gate is biased below (above) the threshold voltage for N-channel (P-channel) MOSFETs. Punchthrough occurs as a result of a drain depletion layer extending from the drain into the channel. One conventional method of preventing punchthrough is to form the MOSFET with a channel length (distance between the source and drain) sufficient to prevent the drain depletion layer from extending across the channel. However, it is desirable to reduce the channel length to reduce the substrate surface area occupied by the MOSFET thereby allowing higher density devices to be fabricated.

One conventional method of reducing the channel length while maintaining sufficient punchthrough protection is to reduce the junction depth of the source/drain in the substrate. De La Moneda, U.S. Pat. No. 4,016,587 (hereinafter De La Moneda), teaches a raised source and drain IGFET device having shallow source/drain junctions in the substrate. Referring to FIG. 1i of De La Moneda, a raised source protrusion 13 and drain protrusion 15 are illustrated. Also shown in FIG. 1i are source junctions 17 and 22 and drain junctions 19 and 24 formed in a silicon wafer 2.

After formation of source protrusion 13, drain protrusion 15 and the respective junctions 17, 22 and 19, 24, an oxide layer 34 is grown over all the exposed silicon surfaces to insure that gate 9, source protrusion 13 and drain protrusion 15 are electrically isolated from field shields 7 and 11 and from each other. However, during the thermal cycle in which oxide layer 34 is grown, junctions 17, 22 and 19, 24 are driven substantially deeper into substrate 2. This excessive dopant diffusion undesirably degrades punchthrough protection. Further, the method taught by De La Moneda is complex and requires numerous fabrication steps. Yet, it is desirable to reduce the number of fabrication steps and to simplify the process used to produce the MOSFET.

Another conventional method of reducing the junction depth of the source/drain in the substrate is to grow a selective epitaxial layer and dope this selective epitaxial layer to form elevated source and drain regions as taught by Hsu et al. (Hsu), U.S. Pat. No. 5,504,031. Referring to Hsu FIG. 12, a selective epitaxial layer is grown and doped to form n-channel elevated source/drain regions 34 extending from sidewalls 22 to field oxide regions 12 and p-channel elevated source/drain regions 40 extending from sidewalls 26 to field oxide regions 12. However, the present inventors have discovered that faceting of the selective epitaxial layer unpredictably increases the junction depth of the source/drain in the substrate.

Present FIG. 1 is a cross-sectional view a portion of a MOSFET having a selective epitaxial layer illustrating the problem of faceting. Referring to FIG. 1, during growth of epitaxial layer 10, a growth plane 12 (growth along a different crystallographic plane than the principal surface of the epitaxial layer) is formed where epitaxial layer 10 meets sidewall spacer 14. The formation of growth plane 12 is well known to those skilled in the art and is commonly referred to as faceting. As a result of faceting, epitaxial layer 10 is thinner where epitaxial layer 10 meets sidewall spacer 14. Implanted impurities readily pass through this thinner portion of epitaxial layer 10 into substrate 16 compared to the thicker portions of epitaxial layer 10. Thus, the junction depth of the source/drain in the substrate is greatest near the channel (and sidewall spacer 14) which degrades punchthrough protection. Accordingly, it is desirable to have a method of forming a MOSFET which does not use a selective epitaxial layer growth technique.

Another important device characteristic is the threshold voltage, i.e. the voltage applied to the conductive gate layer at which the channel between the source and drain becomes conductive. Among other things, the threshold voltage is determined in part by the source/drain voltage (the voltage between the source and drain). However, it is desirable to minimize variations in the threshold voltage from variations in the source/drain voltage, i.e. to control the conduction of the channel by the voltage applied to the conductive gate layer independent of the source/drain voltage.

One conventional method of reducing the effect on threshold voltage of the source/drain voltage is to reduce the junction depth of the source/drain in the substrate. However, as discussed above, conventional techniques provide only a limited reduction in the junction depth of the source/drain in the substrate.

Other obstacles in scaling down MOSFETs to feature sizes below 0.5 $\mu$m are the limitations in conventional photolithographic masking techniques and particularly the inability to precisely pattern the mask, i.e. the tolerance associated with positioning the mask. To accommodate photolithographic masking tolerance of each masking step, the feature size of the MOSFET must be increased to insure reliability of the MOSFET which limits reduction in feature size. Accordingly, it is desirable to fabricate MOSFETs using the fewest number of photolithographic masking steps to reduce feature size.

The art needs a method of fabricating MOSFETs with a junction depth of the source/drain in the substrate which is sufficiently shallow to provide adequate punchthrough protection and threshold voltage control in MOSFETs with reduced feature size. Further, the method should minimize the number of photolithographic masking steps used, to allow further reductions in feature size.

SUMMARY OF THE INVENTION

In accordance with the present invention, a method of fabricating a MOSFET includes providing a semiconductor substrate having a principal surface, a planarized first field oxide region at the substrate principal surface and a gate structure overlying the substrate principal surface. A sidewall spacer is formed adjacent a side of the gate structure. A polysilicon layer is then formed overlying the substrate, the polysilicon layer having a raised first portion overlying the gate structure. A masking layer is formed overlying the polysilicon layer and then blanket etched to expose the raised first portion of the polysilicon layer. The raised first portion of the polysilicon layer is then removed.

In a second embodiment, a method of fabricating a pair of MOSFETs includes providing a semiconductor substrate having a principal surface, planarized first and second field oxide regions at the substrate principal surface and first and second gate structures overlying the substrate principal surface. Sidewall spacers are then formed adjacent sides of the first and second gate structures. A polysilicon layer is then formed overlying the substrate, the polysilicon layer having raised first and second portions overlying the first and second gate structures, respectively. A masking layer is then formed overlying the polysilicon layer and blanket etched to expose the raised first and second portions of the polysilicon layer. The raised first and second portions of the polysilicon layer are then removed.

Of importance, the raised first portion (and second portion in the second embodiment) of the polysilicon layer is (are) removed without using photolithography to pattern a masking layer. This allows the gate structure to be patterned at the minimum dimension obtainable using photolithographic techniques, i.e. at the critical dimension. This enables the feature size of a MOSFET in accordance with the present invention to be reduced compared to the prior art.

In accordance with another embodiment of the present invention, a MOSFET having raised source/drain regions and shallow source/drain junctions includes a semiconductor substrate having a principal surface and a planarized field oxide region at the substrate principal surface. A gate structure is located overlying the substrate principal surface, a sidewall spacer being adjacent a side of the gate structure. A first raised source/drain region (i.e. an electrically conductive structure) is located overlying the substrate principal surface and extends from the sidewall spacer to a position overlying the field oxide region. The first raised source/drain region has a first portion overlying the field oxide region, a second portion overlying the sidewall spacer and a third portion overlying the substrate principal surface. The first raised source/drain region and the portions thereof have a substantially uniform thickness.

The MOSFET can further include first and second semiconductor regions having a first conductivity type in the substrate. The first semiconductor region is laterally-aligned with the side of the gate structure and laterally extends to the field oxide region. The second semiconductor region is laterally-aligned with the sidewall spacer and laterally extends to the field oxide region.

By forming shallow source/drain junctions in the substrate, the drain depletion layer between the source and drain of the MOSFET is suppressed which advantageously increases the source/drain voltage at which punchthrough occurs compared to the prior art. This allows the width of the gate structure to be reduced thereby allowing high density MOSFETs to be fabricated. Forming shallow source/drain junctions in the substrate also reduces the effect on threshold voltage of the source/drain voltage.

In accordance with another embodiment of the present invention, a MOSFET pair with raised source/drain regions and shallow source/drain junctions which share a common source/drain include a semiconductor substrate having a principal surface and planarized first and second field oxide regions at the substrate principal surface. First and second gate structures are located overlying the substrate principal surface. The MOSFET pair further include a shared raised source/drain region, (i.e. an electrically conductive structure) overlying the substrate principal surface which extends from a first sidewall spacer adjacent a first side of the first gate structure to a second sidewall spacer adjacent a first side of the second gate structure. The shared raised source/drain region forms a portion a source/drain shared by the MOSFET pair.

By sharing a source/drain, the MOSFET pair occupy less surface area on a substrate compared to a conventional MOSFET pair in which each MOSFET has its own separate source and drain. In particular, since the MOSFET pair share a source/drain, the MOSFET pair are formed with one less source/drain (with three source/drains) compared to a conventional MOSFET pair with four source/drains. Since each source/drain occupies a certain surface area on a substrate, the surface area is reduced allowing high density MOSFETs to be fabricated.

These and other objects, features and advantages of the present invention will be more readily apparent from the detailed description of the preferred embodiments set forth below taken in conjunction with the accompanying drawings.

DETAILED DESCRIPTION OF THE PREFERRED EMBODIMENTS

Figure 1:
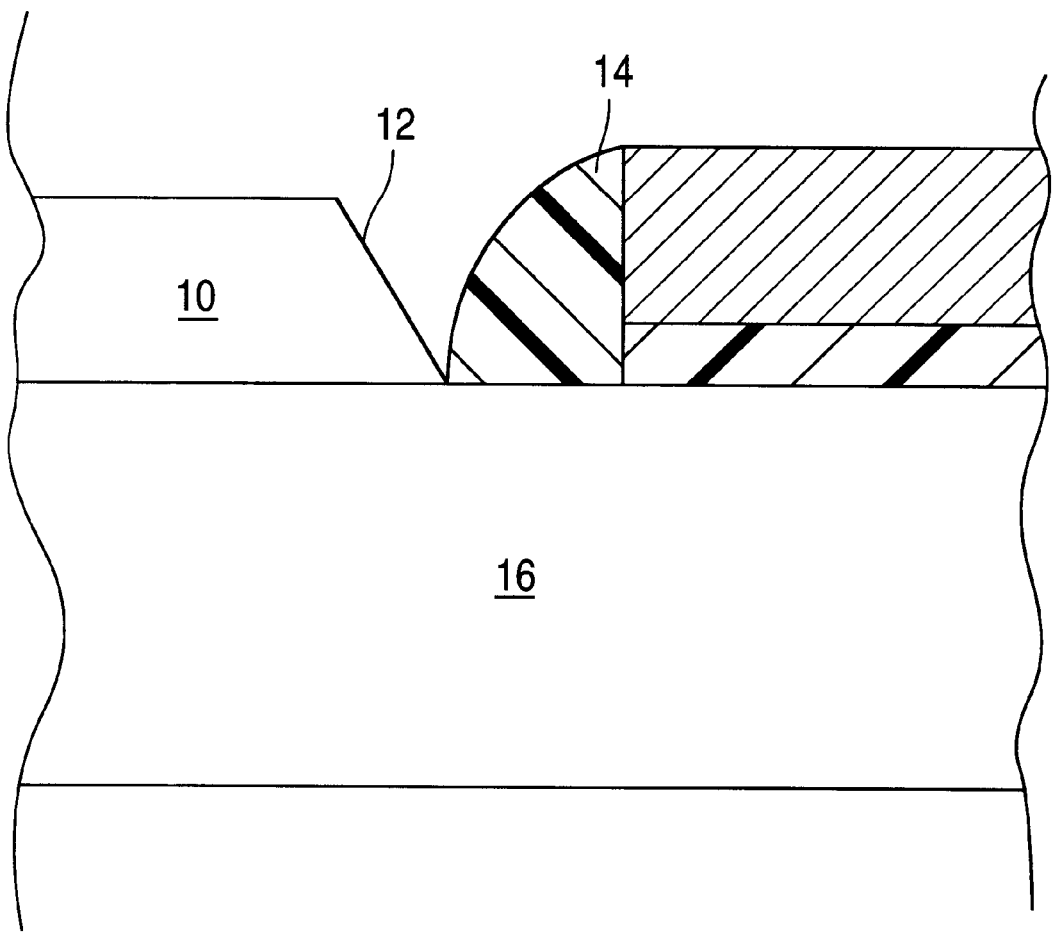
FIG. 1 is a cross-sectional view of a portion of a MOSFET having a selective epitaxial layer illustrating the problem of faceting.
Figure 2:
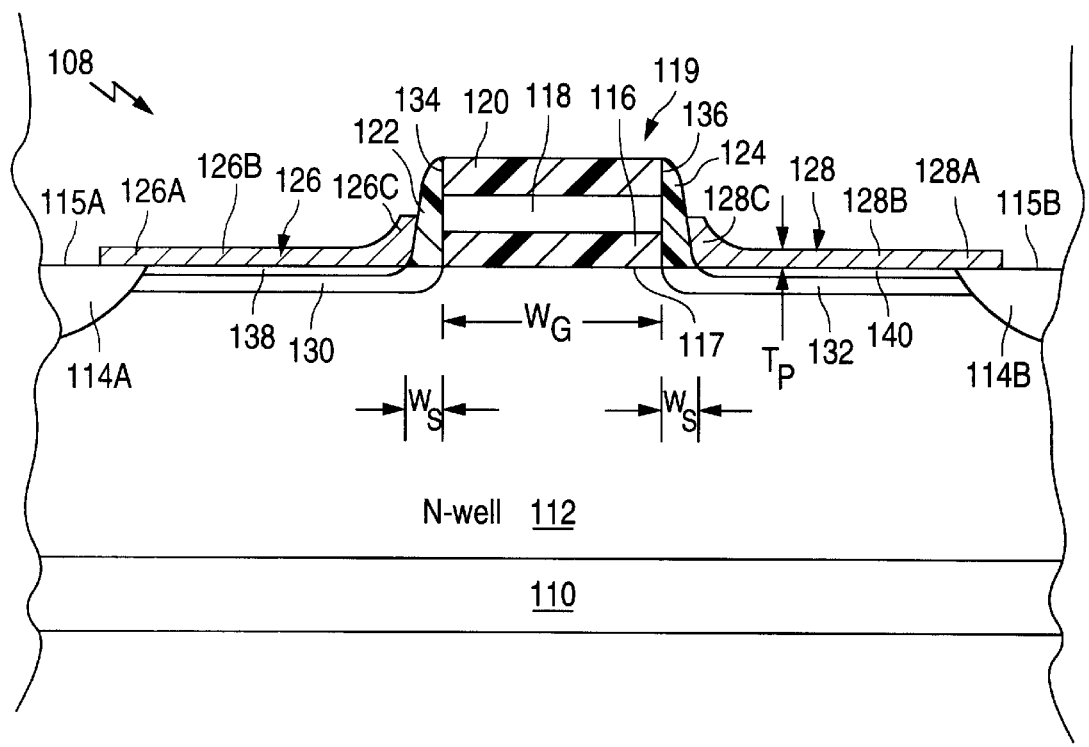
FIG. 2 is a cross-sectional view of a MOSFET in accordance with the present invention.

FIG. 2 is a cross-sectional view of a MOSFET 108 in accordance with the present invention. A conventional N-well 112 is formed in a substrate 110. Formed at the principal surface 117 of substrate 110 are conventional field oxide regions 114A and 114B. Field oxide regions 114A, 114B are planarized, i.e. have upper surfaces 115A, 115B, respectively, which are planar and in the plane defined by substrate principal surface 117.

A conventional gate structure 119 of MOSFET 108 includes a gate oxide layer 116, an electrically conductive gate layer 118 and a second oxide layer 120. As shown in FIG. 2, gate oxide layer 116 overlies substrate principal surface 117, gate layer 118 overlies gate oxide layer 116 and second oxide layer 120 overlies gate layer 118. Formed adjacent sides 134, 136 of gate structure 119 are conventional sidewall spacers 122, 124, respectively.

Overlying substrate principal surface 117 is an electrically conductive raised source/drain region 126 (i.e. an electrically conductive structure) extending laterally from sidewall spacer 122 to a position above field oxide region 114A. Raised source/drain region 126 includes a first portion 126A formed on a portion of field oxide region 114A, a second portion 126B formed on a portion of substrate principal surface 117 and a third portion 126C formed on a portion of sidewall spacer 122. First, second and third portions 126A, 126B, 126C are all of a substantially uniform (e.g. no greater than 10% variation) thickness $T_P$. Illustratively, thickness $T_P$ is in the range of 1000 Å to 5000 Å.

Similarly, overlying substrate principal surface 117 is an electrically conductive raised source/drain region 128 (i.e. an electrically conductive structure) extending laterally from sidewall spacer 124 to a position above field oxide region 114B. Raised source/drain region 128 includes a first portion 128A formed on a portion of field oxide region 114B, a second portion 128B formed on a portion of substrate principal surface 117 and a third portion 128C formed on a portion of sidewall spacer 124. First, second and third portions 128A, 128B, 128C are also of a substantially uniform thickness $T_P$.

Formed in substrate 110, and in particular in N-well 112, are shallow (in terms of depth) and lightly doped P− source/drain junctions 130, 132 (hereinafter P− junctions 130, 132). Illustratively, P− junctions 130, 132 have dopant concentrations in the range of $1\times10^{17}$ atoms/cm$^3$ to $1\times10^{19}$ atoms/cm$^3$ and depths (from substrate principal surface 117) in the range of 0.05 μm to 0.3 μm. As shown in FIG. 2, P− junctions 130, 132 (i.e. the source/drain regions) are laterally-aligned with sides 134, 136 of gate structure 119 and laterally extend to field oxide regions 114A, 114B, respectively.

Formed within substrate 110, and more particularly within P− junctions 130, 132, are shallow and heavily doped P+ source/drain junctions 138, 140 (hereinafter P+ junctions 138, 140), respectively. Illustratively, P+ junctions 138, 140 have dopant concentrations in the range of $1\times10^{19}$ atoms/cm$^3$ to $1\times10^{21}$ atoms/cm$^3$ and depths (from substrate principal surface 117) in the range of 0.01 μm to 0.2 μm. As shown in FIG. 2, P+ junctions 138, 140 (i.e. the source/drain contact regions) are laterally-aligned with sidewall spacers 122, 124 and laterally extend to field oxide regions 114A, 114B, respectively.

Raised source/drain region 126 is in physical and electrical contact with P+ junction 138 and is in electrical contact (via P+ junction 138) with P− junction 130. As such, raised source/drain region 126, P+ junction 138 and P− junction 130 collectively are referred to as a first source/drain of MOSFET 108. Similarly, raised source/drain region 128 is in physical and electrical contact with P+ junction 140 and is in electrical contact (via P+ junction 140) with P− junction 132. As such, raised source/drain region 128, P+ junction 140 and P− junction 132 collectively are referred to as a second source/drain of MOSFET 108. (In a transistor of this type, the source and drain are similar in structure).

Forming shallow P− junctions 130, 132 and shallow P+ junctions 138, 140 advantageously suppresses the vertical component of the drain depletion layer and accordingly suppresses the drain depletion layer. Suppressing the drain depletion layer advantageously enhances punchthrough protection (increases the source/drain voltage at which punchthrough occurs). This allows the width $W_G$ of the gate structure 119, i.e. the distance between sides 134 and 136 of gate structure 119, to be reduced (e.g. by 10% to 20%) compared to the prior art. Accordingly, the surface area of substrate 110 occupied by MOSFET 108 is reduced allowing higher density devices to be fabricated.

Forming shallow P− junctions 130, 132 and P+ junctions 138, 140 also reduces the effect on threshold voltage of the source/drain voltage. This is because shallow source/drain junctions reduce or eliminate the portion of the channel at the channel edge which is controlled by the source/drain voltage. Accordingly, the source/drain voltage has a reduced effect on threshold voltage, i.e. the threshold voltage is substantially independent of the source/drain voltage. Illustratively, threshold voltage variations from source/drain voltage is less than or equal to 50 mv (100 mv) for 0.5 μm (0.3 μm) technology.

Figure 3:
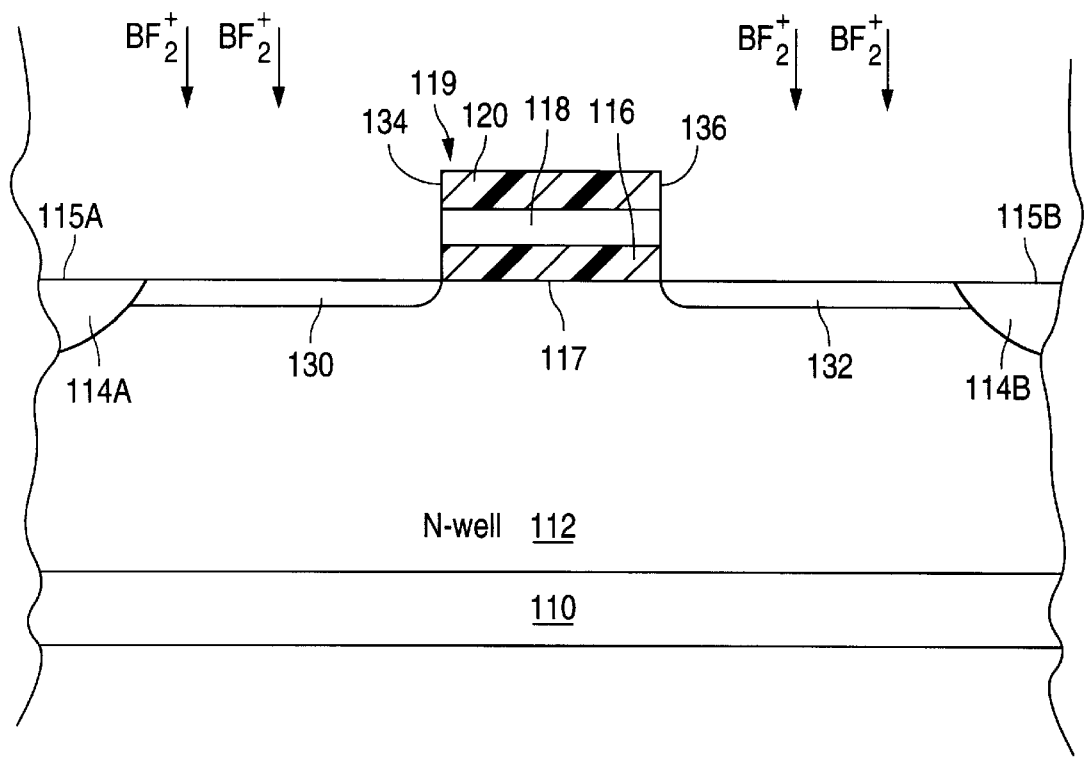
FIG. 3 is a cross-sectional view of the MOSFET of FIG. 2 during fabrication in accordance with the present invention.

Elements in the various figures which are substantially similar are designated by similar reference numbers. FIG. 3 is a cross-sectional view of the MOSFET of FIG. 2 during fabrication in accordance with the present invention. As shown in FIG. 3, N-well 112 is formed in substrate 110, typically a silicon substrate, using conventional techniques. At substrate principal surface 117, field oxide regions 114A, 114B (silicon oxide, SiO$_x$) are formed using conventional techniques, for example a LOCOS technique or shallow trench with oxide fill. Although a separately doped N-well 112 is illustrated in FIG. 3, a separately doped well region does not have to be formed. For example, instead of forming a separately doped N-well 112, substrate 110 can be an N type substrate. Further, in an alternative embodiment, field oxide regions 114A, 114B are formed before N-well 112 is formed using techniques well known to those skilled in the art.

As shown in FIG. 3, field oxide regions 114A, 114B are planarized. Field oxide regions 114A, 114B are planarized using a suitable conventional technique, for example a chemical-mechanical polishing (CMP) technique. Illustratively, field oxide regions 114A, 114B have thicknesses in the range of 2000 Å to 5000 Å before planarization.

The planarization of field oxide regions 114A, 114B result in upper surfaces 115A, 115B of field oxide regions 114A, 114B, respectively, which are planar and in the plane defined by substrate principal surface 117. Field oxide regions 114A, 114B are typically planarized to provide a planar surface for photolithography used to define the gate of the MOSFET. (Radiation used to pattern photoresist is best focussed on a planar surface thus planarization allows realization of smaller feature sizes.) Planarization of field oxide regions 114A, 114B becomes increasingly important as the feature size of the MOSFET is reduced to below 0.5 μm.

After field oxide regions 114A, 114B are planarized, a gate structure 119 is formed overlying substrate principal surface 117 using conventional techniques. Gate structure 119 includes gate oxide layer 116, gate layer 118 and second oxide layer 120. Gate oxide layer 116 is typically a thermally grown or chemical vapor deposition (CVD) oxide layer but can also be formed of other electrically insulating materials.

Gate layer 118 is typically formed of heavily doped polycrystalline silicon "polysilicon" but can be formed of other electrically conductive materials. Further, gate layer 118 can be one or more layers of electrically conductive material. For example, when gate layer 118 is a polycide layer, it includes a doped polysilicon layer with an overlying metal silicide layer such as tungsten silicide, molybdenum silicide or titanium silicide. Second oxide layer 120 is typically a CVD oxide layer but can also be formed of other electrically insulating materials such as silicon nitride ($Si_3N_4$). Illustratively, thicknesses for gate oxide layer 116, gate layer 118, and second oxide layer 120 are in the range of 30 Å to 200 Å, 1000 Å to 5000 Å, and 1000 Å to 5000 Å, respectively.

As shown in FIG. 3, the entire structure is then subjected to P type impurity implantation, illustrated as $BF_2^+$, to form P− junctions 130, 132 in N-well 112. The P type impurity is implanted with an energy insufficient to pass the P type impurity through gate structure 119 or field oxide regions 114A, 114B and into the underlying portions of substrate 110. For example, boron fluoride ions ($BF_2^+$) are implanted using an implant energy in the range of 10 kev to 100 kev and an implant dosage of $1\times10^{12}$ atoms/cm$^2$ to $1\times10^{14}$ atoms/cm$^2$. Since the P type impurity does not pass through gate structure 119, field oxide regions 114A, 114B and into the underlying portions of substrate 110, P− junctions 130, 132 are self-aligned (laterally-aligned) to sides 134, 136 of gate structure 119 and laterally extend to field oxide regions 114A, 114B respectively.

Figure 4A:
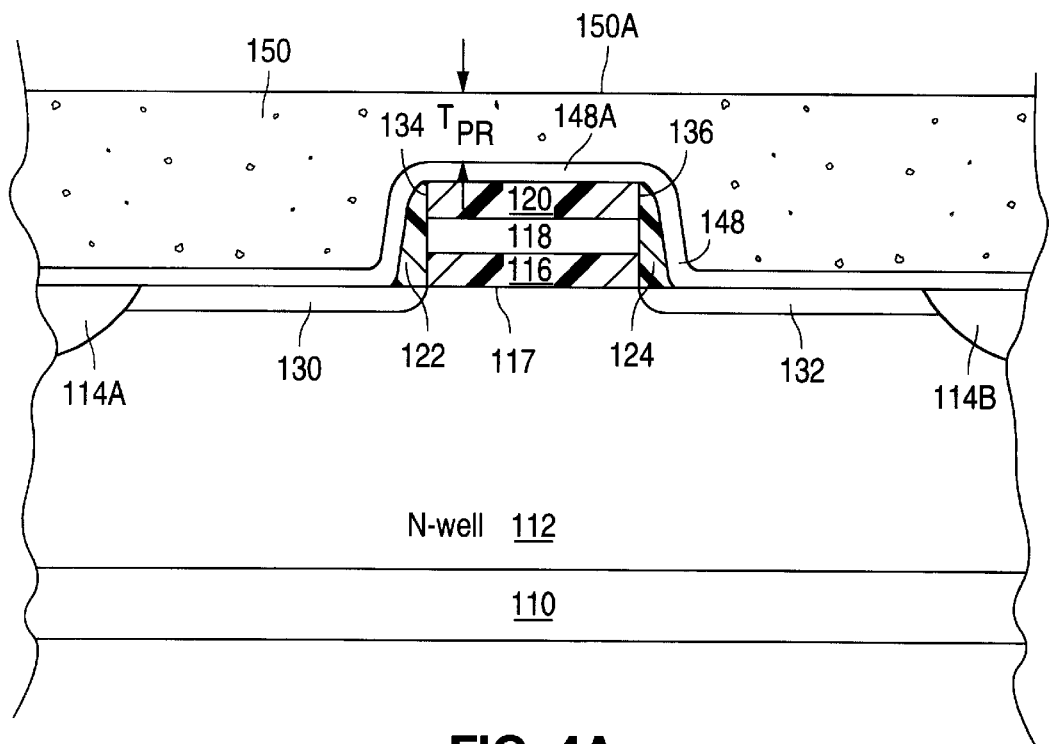
FIG. 4A is a cross-sectional view of the MOSFET of FIG. 2 further along in fabrication in accordance with one embodiment of the present invention.

FIG. 4A is a cross-sectional view of the MOSFET of FIG. 2 further along in processing in accordance with one embodiment of the present invention. As shown in FIG. 4A, sidewall spacers 122, 124 are formed adjacent sides 134, 136 of gate structure 119, respectively, using conventional techniques. Sidewall spacers 122, 124 are an electrically insulating material, for example silicon oxide.

After sidewall spacers 122, 124 are formed, a layer 148, e.g. polysilicon, is formed overlying the entire structure. As shown in FIG. 4A, polysilicon layer 148 follows the topography of the underlying structure. Although layer 148 is illustrated as a single layer, layer 148 can be one or more layers of material. For example, in the case when layer 148 is a polycide layer, then layer 148 includes a polysilicon layer and an overlying metal silicide layer.

After polysilicon layer 148 is formed, a masking layer 150, e.g. photoresist, is formed overlying the entire structure. Although masking layer 150 is typically photoresist, other material besides photoresist can be used. In general, it is desirable to have a material which can be preferentially etched compared to polysilicon layer 148, i.e. a material which can be readily removed without significantly removing polysilicon (or any other material which forms polysilicon layer 148). Of importance, masking layer 150 has a substantially planar surface 150A which is substantially parallel to the plane defined by substrate principal surface 117. As an illustration, a conventional spin-on photoresist would have a substantially planar surface 150A, i.e. would have a surface 150A which does not follow the topography of the underlying structure. Further, as shown in FIG. 4A, masking layer 150 has a thickness $T_{PR}$ over a first portion or raised portion 148A of polysilicon layer 148. Typically, thickness $T_{PR}$ is 1,000 angstroms or more, although it is only necessary to have a thickness $T_{PR}$ which is sufficient to allow the photoresist (or other material) to flow to produce planar 150A.

Figure 4B:
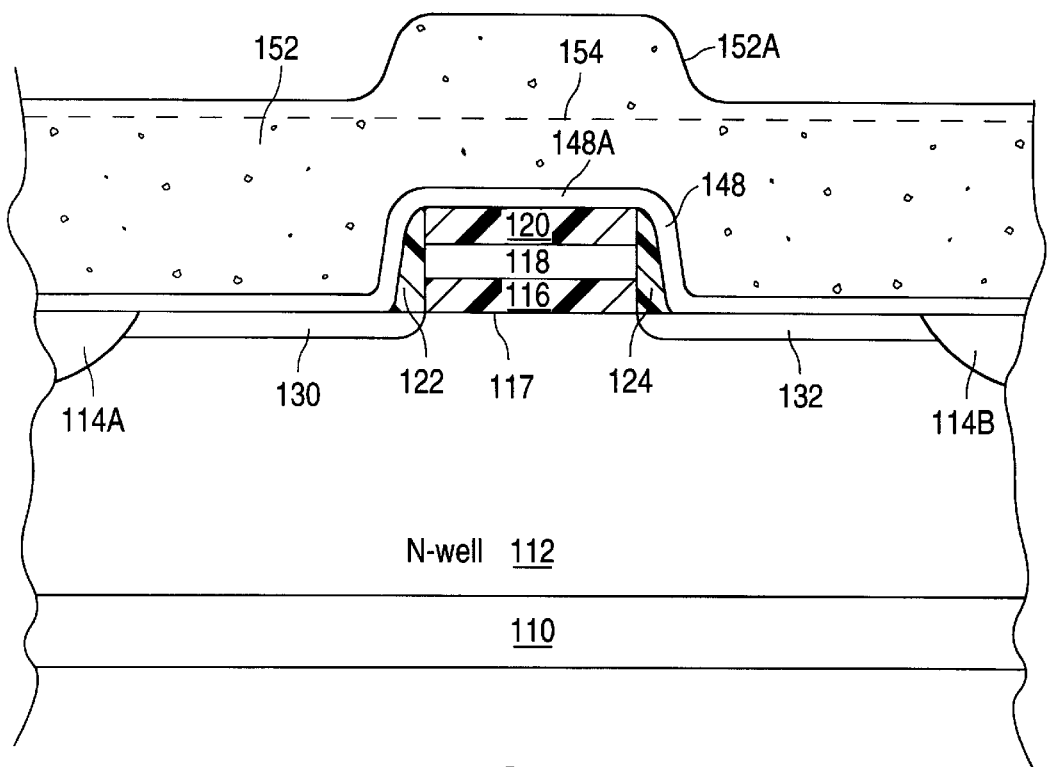
FIG. 4B is a cross-sectional view of the MOSFET of FIG. 2 further along in fabrication in accordance with an alternative embodiment of the present invention.

FIG. 4B is a cross-sectional view of the MOSFET of FIG. 2 further along in processing in accordance with an alternative embodiment of the present invention. In this embodiment, after sidewall spacers 122, 124 and polysilicon layer 148 are formed, another masking layer 152 which etches preferentially to polysilicon layer 148 is formed. For example, masking layer 152 is silicon nitride, boron phosphosilicate glass (BPSG) or phosphosilicate glass (PSG). As shown in FIG. 4B, the upper surface 152A of masking layer 152 approximately follows the topography of the underlying structure. After masking layer 152 is formed, the structure is chemically-mechanically polished (planarized) during which upper surface 152A is ground down to be a substantially planar surface, indicated by the dashed line 154, which is substantially parallel to the plane defined by substrate principal surface 117.

Figure 5:
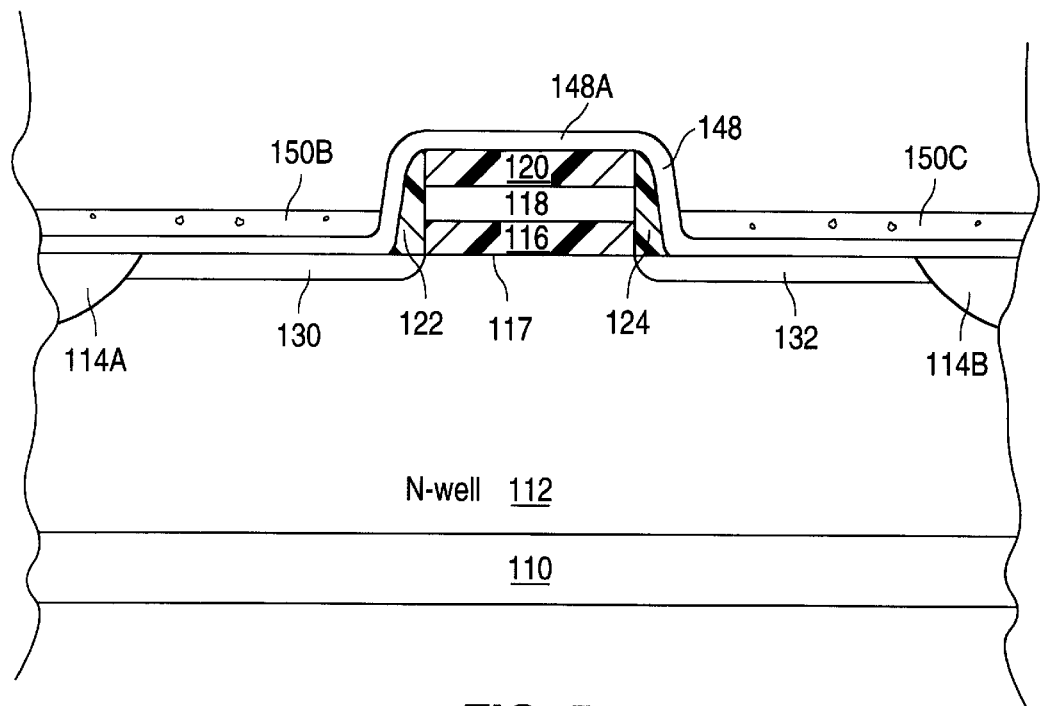
FIGS. 5 and 6 are cross-sectional views of the MOSFET of FIG. 2 at various stages further along in fabrication in accordance with the FIG. 4A embodiment of the present invention.

FIG. 5 is a cross-sectional view of the MOSFET of FIG. 2 further along in processing in accordance with the FIG. 4A embodiment of the invention. As shown in FIG. 5, masking layer 150 (FIG. 4A) is blanket etched (etched uniformly) to leave remaining first and second portions 150B, 150C of masking layer 150. When masking layer 150 is a photoresist, masking layer 150 can be blanket etched using a conventional ashing technique (ashing involves oxidation of the photoresist). As shown in FIG. 5, portions 150B, 150C of masking layer 150 leave exposed raised portion 148A of polysilicon layer 148.

Figure 6:
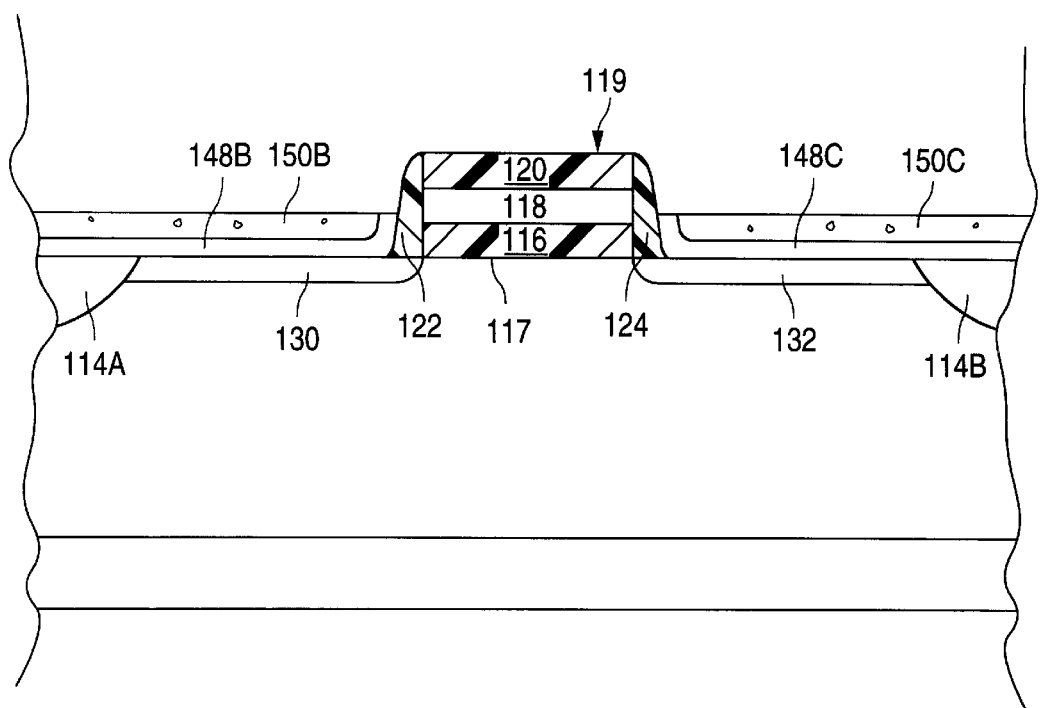

As shown in FIG. 6, the exposed raised portion 148A of polysilicon layer 148 (FIG. 5) is removed using portions 150B, 150C of masking layer 150 as a mask. Since second oxide layer 120 and sidewall spacers 122, 124 are formed of materials (e.g. silicon oxide) having etch selectivity to polysilicon layer 148, significant etching of gate structure 119 is prevented. After raised portion 148A is removed, portions 148B, 148C (which underlie portions 150B, 150C of masking layer 150, respectively) of polysilicon layer 148 remain.

FIGS. 5, 6 are in accordance with the embodiment illustrated in FIG. 4A, i.e. using masking layer 150. However, it is understood that a similar process is used to form portions (similar to portions 150B, 150C of masking layer 150, see FIGS. 5, 6) of masking layer 152 in the embodiment of FIG. 4B. In the case where masking layer 152 is silicon nitride, a suitable etchant for the blanket etch of masking layer 152 is phosphoric acid.

Figure 7:
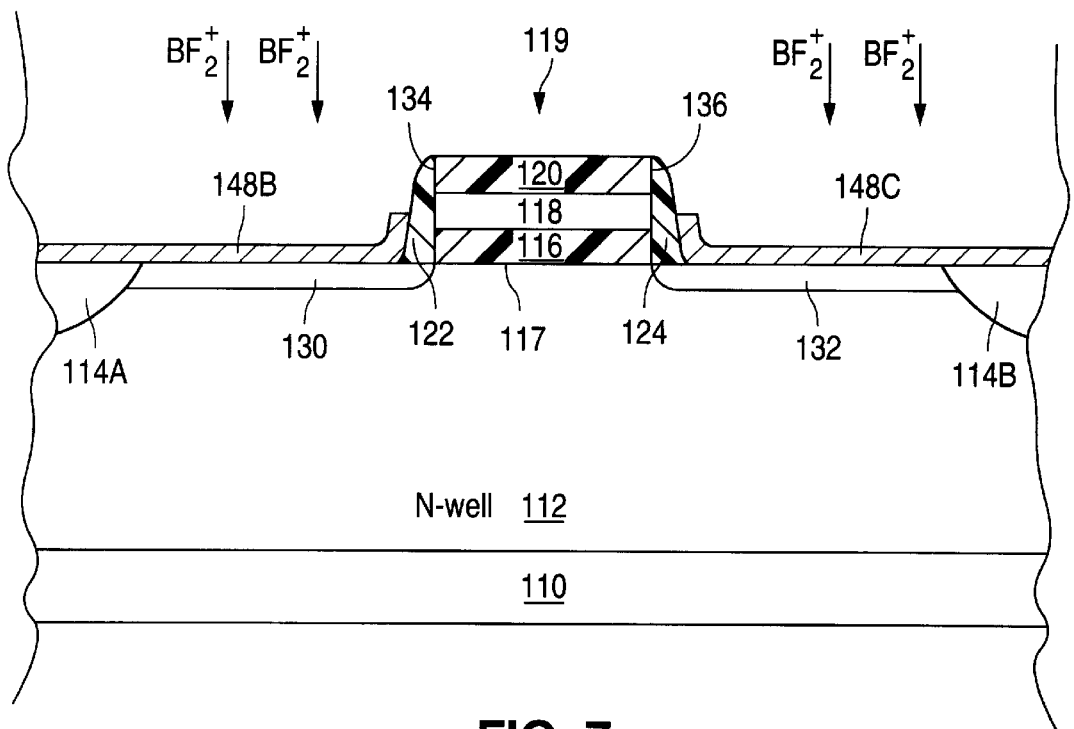
FIGS. 7, 8, 9 and 10 are cross-sectional view of the MOSFET of FIG. 2 at various stages further along in fabrication in accordance with the present invention.

As shown in FIG. 7, the remaining portions 150B, 150C of masking layer 150 (or the remaining portions of masking layer 152) are removed. The structure is then subjected to a P type impurity implantation, again illustrated as $BF_2^+$. For example, $BF_2^+$ is implanted at an implant energy of 60 kev and an implant dosage in the range of $1\times10^{15}$ atoms/cm$^2$ to $5\times10^{15}$ atoms/cm$^2$. The P type impurity does not pass through field oxide regions 114A, 114B, gate structure 119 or through sidewall spacers 122, 124 and into the underlying portions of substrate 110. The P type impurity does enter into the remaining portion 148B, 148C of polysilicon layer 148 and thereby dopes them to have P type conductivity.

In an alternative embodiment, instead of doping portions 148B, 148C as illustrated in FIG. 7, the P type impurity is implanted into these portions of polysilicon layer 148 (FIGS. 4A, 4B) before polysilicon layer 148 is etched to define the singulated portions 148B, 148C. Referring to FIG. 4A (FIG. 4B), in this alternative embodiment, after polysilicon layer 148 is formed and before masking layer 150 (masking layer 152) is formed, the structure is subjected to a P type impurity implantation. The P type impurity implanted, the implant energy and the implant dosage are similar to those described in reference to FIG. 7. The P type impurity dopes polysilicon layer 148 to have P type conductivity. After the P type impurity is implanted into polysilicon layer 148, then masking layer 150 (masking layer 152) is formed and processing continues as described above.

Regardless of whether portions 148B, 148C of layer 148 are doped before patterning (FIGS. 4A, 4B) or after patterning (FIG. 7), the structure is heated to a sufficient temperature and for a sufficient duration to drive some of the P type impurities in portions 148B, 148C into the underlying portions of substrate 110. As an illustration, the structure is heated to a temperature in the range of 800° C. to 950° C. for 1.0 hour. Alternatively, a conventional rapid thermal anneal is performed, illustratively, to heat the substrate to a temperature in the range of 900° C. to 1000° C. for 20 to 30 seconds.

Referring again to FIG. 2, during the thermal cycle, the P type impurities diffuse from portions 148B, 148C (FIG. 7) into substrate 110 to form P+ junctions 138, 140 in P− junctions 130, 132, respectively. (This thermal cycle also drives P− junctions 130, 132 laterally to extend slightly under gate structure 119.) During this thermal cycle, the P type impurities also diffuse throughout portions 148B, 148C.

In accordance with another embodiment of the present invention, P− junctions 130, 132 and P+ junctions 138, 140 are formed without performing the P type impurity implantation of FIG. 3. Accordingly, this embodiment is similar to the embodiments illustrated in FIGS. 3, 4A, 4B, 5, 6, and 7 except that P− junctions 130, 132 would not be illustrated in the figures in this embodiment. Referring now to FIG. 7, in this alternative embodiment, the P type impurity implantation illustrated in FIG. 7 is performed to implant P type impurities into portions 148B, 148C. After the P type impurities are implanted into portions 148B, 148C, a thermal cycle is performed during which the P type impurities diffuse throughout portions 148B, 148C as described above. However, in accordance with this embodiment, some of the P type impurities also diffuse into substrate 110, in particular into N-well 112, to form P− junctions 130, 132 and P+ junctions 138, 140 (FIG. 2) simultaneously. P+ junctions 138, 140 are formed because the P type impurity concentration is higher near the source of the P type impurities, namely near portions 148B, 148C. P− junctions 130, 132 are formed because the P type impurity concentration diminishes as the distance from portions 148B, 148C increases.

The thermal cycle time and temperature are selected so that the P type impurities diffuse laterally to extend slightly under gate structure 119, i.e. P− junctions 130, 132 are laterally-aligned with side 134, 136 of gate structure 119, respectively. In accordance with this embodiment, the width $W_S$ (FIG. 2) of sidewall spacers 122, 124 is of increased importance. In particular, it is important to accurately control width $W_S$ so that the lateral distance over which the P type impurities diffuse through substrate 110 from portions 148B, 148C to sides 134, 136 of gate structure 119, respectively, is accurately controlled. Accurately controlling the lateral distance over which the P type impurities diffuse allows the thermal cycle time and temperature to be selected with precision. (Too long or hot of a thermal cycle results in excessive dopant diffusion whereas too short or cool of a thermal cycle does not drive the P type impurities to gate structure 119). Illustratively, width $W_S$ is in the range of 500 Å to 2000 Å.

Of further importance, the thickness $T_P$ of portions 148B, 148C should be accurately controlled, e.g. to have variations no greater than ±10%. Thickness $T_P$ should be accurately controlled since the P type impurities pass through portions 148B, 148C to reach substrate principal surface 117. Thus, variations in thickness $T_P$ results in variations in the amount of P type impurities which diffuse to substrate principal surface 117 for a given thermal cycle.

Figure 8:
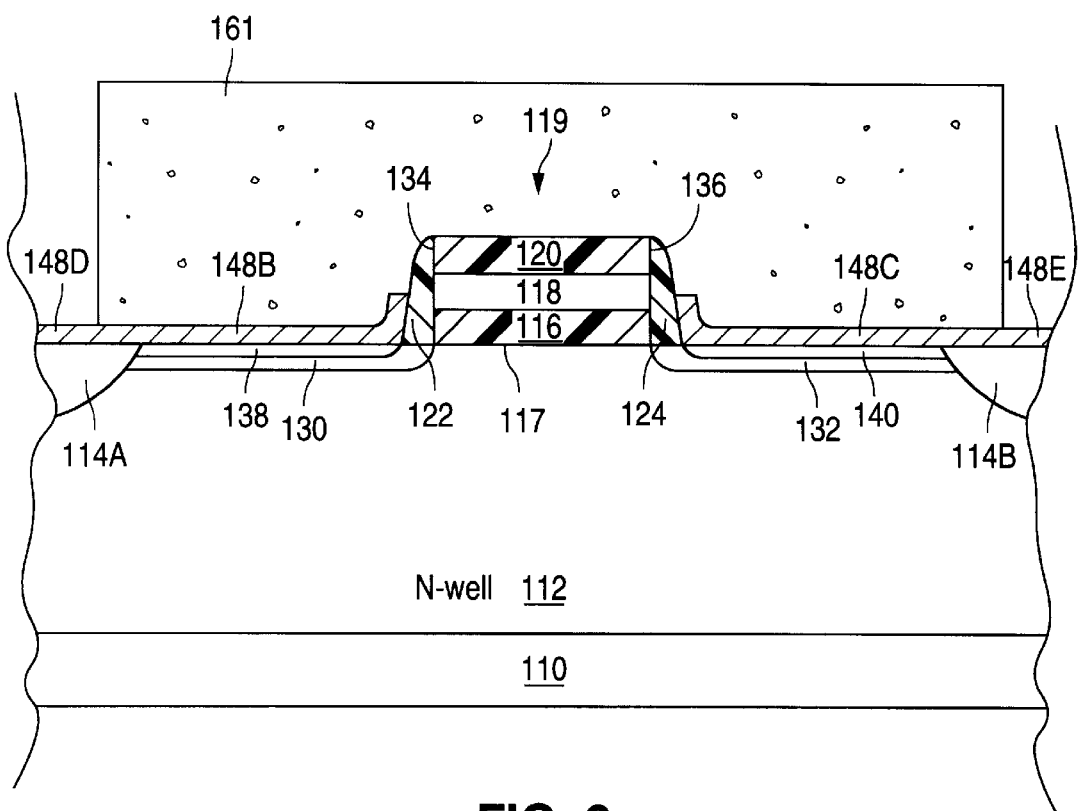

FIG. 8 is a cross-sectional view of the MOSFET of FIG. 2 further along in processing in accordance with the present invention. A suitable material, typically photoresist, is applied over the entire structure and patterned using conventional techniques to form a source/drain mask 161. As shown in FIG. 8, source/drain mask 161 leaves exposed sections 148D, 148E of portions 148B, 148C overlying field oxide regions 114A, 114B, respectively. Using source/drain mask 161, exposed sections 148D, 148E of portions 148B, 148C, respectively, are removed using a suitable etchant. The remaining sections of portions 148B, 148C define raised source/drain regions 126, 128, respectively. Source/drain mask 161 is then removed resulting in the structure illustrated in FIG. 2.

In an alternative embodiment, after raised source/drain regions 126, 128 are patterned from portions 148B, 148C as illustrated in FIG. 8, then the P type impurity implantation is performed to dope source/drain regions 126, 128 to have P type conductivity. (In this alternative, the P type impurity implantation of FIG. 7 is not performed and the P type impurity implantation of FIG. 3 may or may not be performed.) Following this P type implantation, the thermal cycle is performed to drive some of the P type impurities to form P+ junctions 138, 140 (and P− junctions 130, 132 if the P type impurity implantation of FIG. 3 was not performed).

In accordance with another embodiment, sections 148D, 148E of portions 148B, 148C are removed using source/drain mask 161 of FIG. 8 before masking layer 150 of FIG. 4A (masking layer 152 of FIG. 4B) is formed and before raised portion 148A of polysilicon layer 148 (FIG. 5) is removed.

Figure 9:
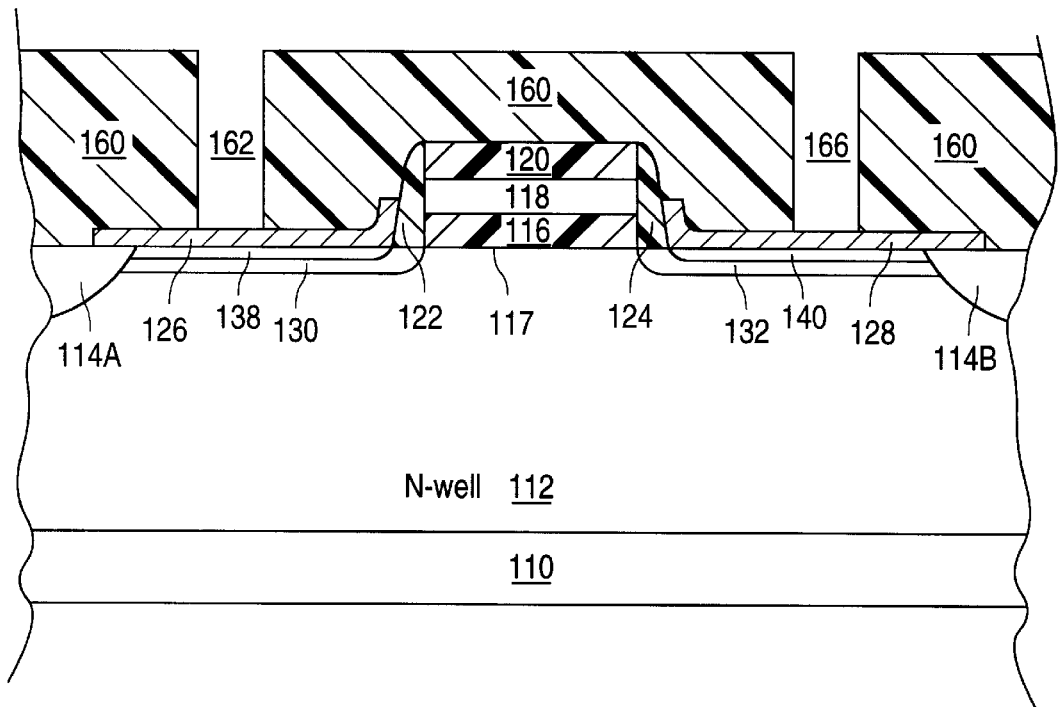

FIG. 9 is a cross-sectional view of the MOSFET of FIG. 2 further along in processing in accordance with the present invention. As shown in FIG. 9, an electrically insulating layer 160, typically silicon oxide or silicon nitride, is formed overlying the entire structure and patterned using conventional techniques. Apertures 162, 166 extend through insulating layer 160 to expose portions of raised source/drain regions 126, 128, respectively.

Figure 10:
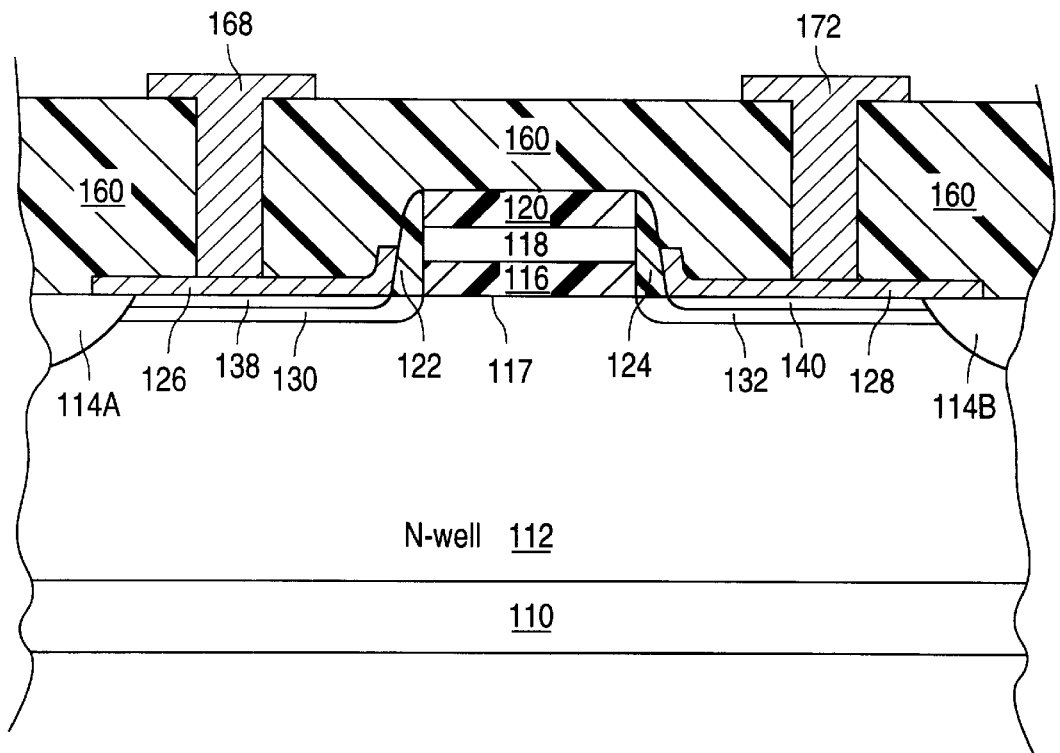

FIG. 10 is a cross-sectional view of the MOSFET of FIG. 2 further along in processing in accordance with the present invention. After apertures 162, 166 (FIG. 9) are formed in insulating layer 160, source/drain contacts 168, 172 are formed from an electrically conductive material (e.g. aluminum) using conventional techniques. As shown in FIG. 10, source/drain contacts 168, 172 extend through apertures 162, 166 and are in electrical contact with raised source/drain regions 126, 128, respectively. Raised source/drain regions 126, 128 serve as lateral extensions of source/drain contacts 168, 172, respectively. The gate contact (not shown) is typically fabricated simultaneous with source/drain contacts 168, 172.

Referring to FIGS. 4A, 4B, 5 and 6, raised portion 148A over gate structure 119 is removed without using complex photolithographic techniques, i.e. without using photolithography to pattern a masking layer. Of importance, this allows gate structure 119 to be patterned at the critical dimension (the minimum dimension obtainable using photolithographic techniques). If portions 148B, 148C were patterned (raised portion 148A removed) using photolithographic techniques, then gate structure 119 would have to be somewhat larger (wider) than the critical dimension to accommodate tolerance in the placement of the mask used to pattern portions 148B, 148C. To accommodate tolerance in the formation of the gate contact to gate structure 119 while patterning gate structure 119 at the critical dimension over the active areas of the MOSFET, the gate contact is formed outside of the active areas (over field oxide) where gate structure 119 is widened. (Active areas are defined by field oxide, i.e. are areas having an absence of field oxide). This enables the feature size of a MOSFET in accordance with the present invention to be reduced compared to the prior art.

Further, referring to FIG. 8, portions 148B, 148C are patterned using source/drain mask 161 to form raised source/drain regions 126, 128. Of importance, there is great flexibility in the placement (or displacement) of source/drain mask 161. In particular, it is only important that source/drain mask 161 is positioned so that raised source/drain regions 126, 128 extend slightly over field oxide regions 114A, 114B, respectively. The distances which raised source/drain regions 126, 128 extend over field oxide regions 114A, 114B, respectively, are not critical. Since there is flexibility in the placement of source/drain mask 161, no additional substrate area is necessary to accommodate tolerance associated with the placement of source/drain mask 161. This enables further reduction in the feature size of a MOSFET in accordance with the present invention compared to the prior art.

Figure 11:
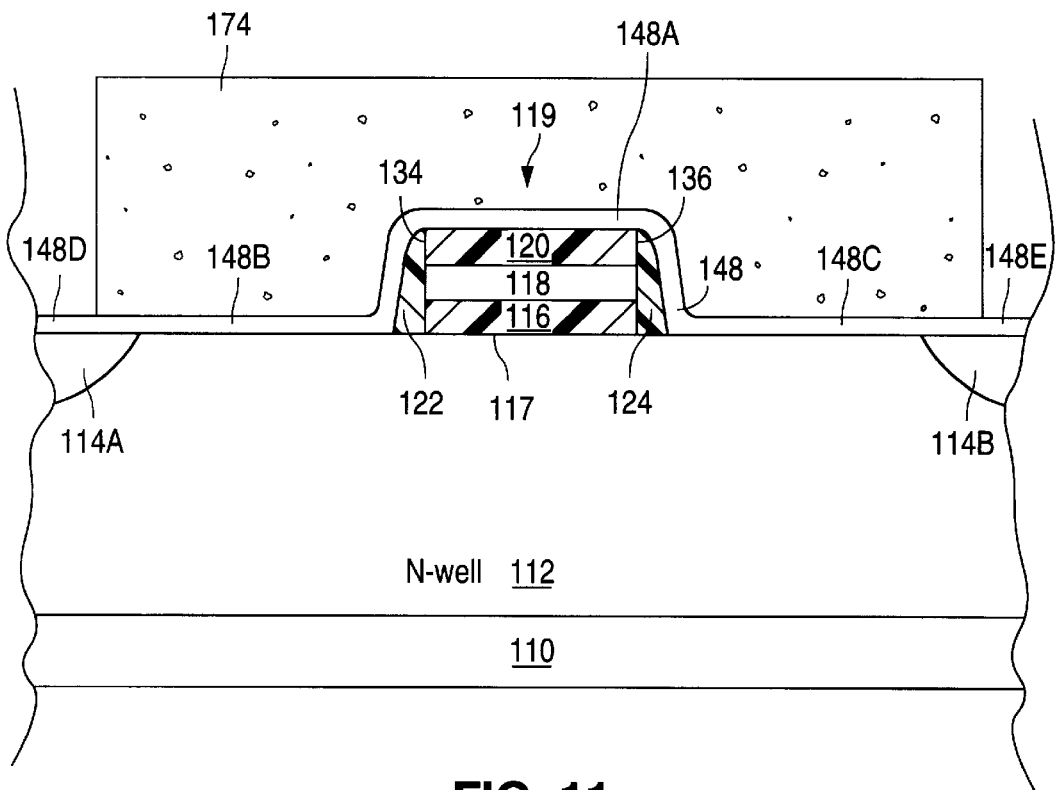
FIGS. 11 and 12 are cross-sectional views of the MOSFET of FIG. 2 at various stages during fabrication in accordance with an alternative embodiment of the present invention.

FIG. 11 is a cross-sectional view of the MOSFET of FIG. 2 during fabrication in accordance with an alternative embodiment of the present invention. In accordance with this embodiment, the FIG. 4A (FIG. 4B) structure is fabricated as discussed above. However, in accordance with this embodiment, masking layer 150 (masking layer 152 after planarization) is patterned using conventional techniques to form a mask 174. As shown in FIG. 11, mask 174 exposes sections 148D, 148E of polysilicon layer 148 overlying field oxide regions 114A, 114B, respectively.

Figure 12:
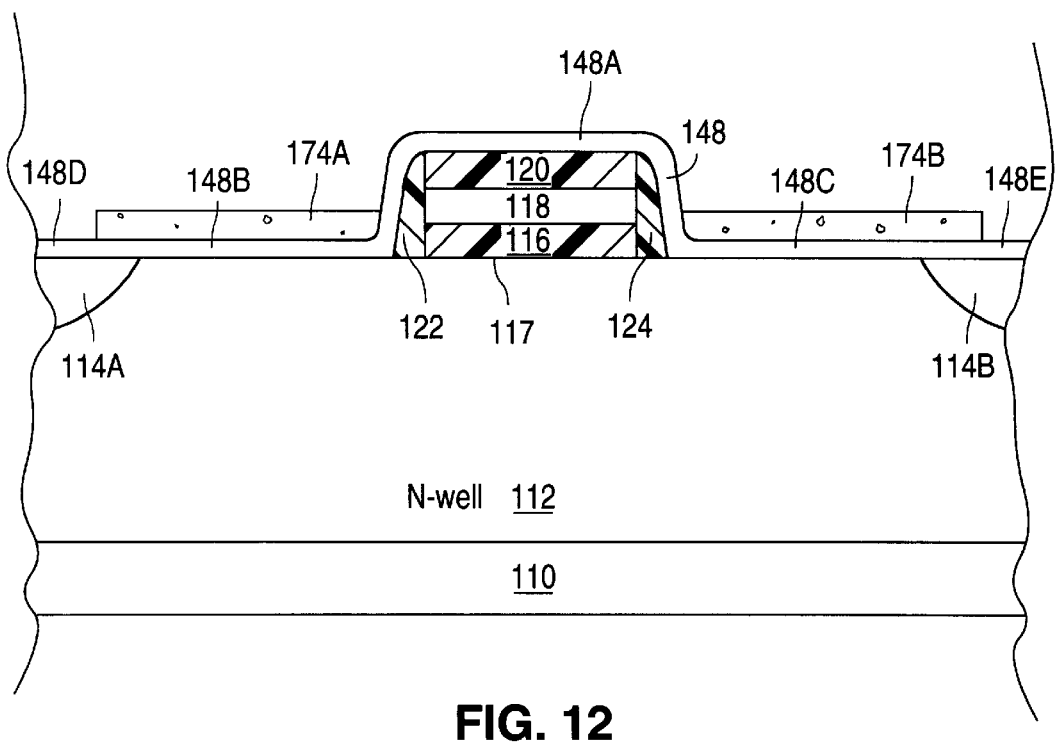

Referring now to FIG. 12, which is a cross-sectional view of the MOSFET of FIG. 2 further along in processing in accordance with this embodiment of the invention, mask 174 is blanket etched to form portions 174A, 174B of mask 174. Exposed sections 148D, 148E and exposed raised portion 148A are then removed using portions 174A, 174B of mask 174 as a mask. Although not illustrated in FIGS. 11 or 12, it is understood that various P type impurity implantations and a thermal cycle as those described in the embodiments above are performed to dope raised source/drain regions 126, 128 to have P type conductivity and also to form P− junctions 130, 132 and P+ junctions 138, 140 (FIG. 2). For convenience, P− junctions 130, 132 and P+ junctions 138, 140 are not illustrated in FIGS. 11, 12. It is understood that alternative embodiments are similar to the embodiment illustrated in FIGS. 11 and 12 except that, depending on the order of fabrication steps, P− junctions 130, 132 or P+ junctions 138, 140 and P− junctions 130, 132 would be illustrated in the figures.

In accordance with the embodiment illustrated in FIGS. 11, 12, raised source/drain regions 126, 128 are fabricated using one less masking step compared to the embodiments illustrated in FIG. 3 to FIG. 10.

Figure 13:
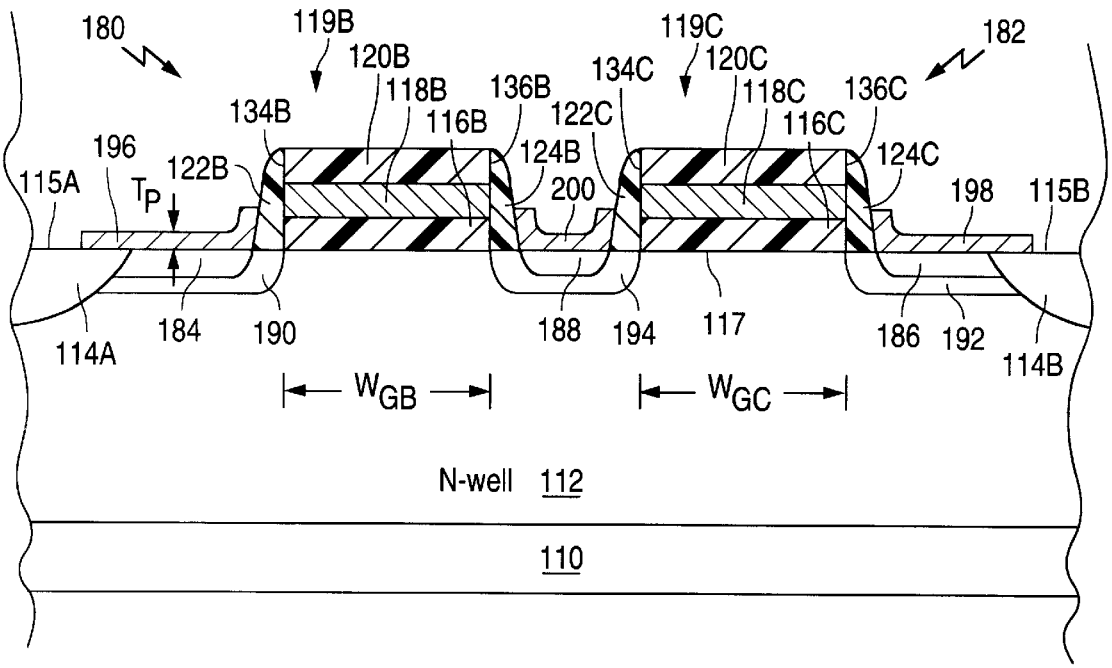
FIG. 13 is a cross-sectional view of a MOSFET pair which share a common source/drain in accordance with an alternative embodiment of the present invention.

FIG. 13 is a cross-sectional view of a MOSFET pair consisting of MOSFETs 180, 182 which share a common source/drain in accordance with an alternative embodiment of the present invention. As shown in FIG. 13, an N-well 112 is formed in a substrate 110. Field oxide regions 114A, 114B are formed at substrate principal surface 117 and planarized as described above.

MOSFET 180 includes a gate structure 119B comprising a gate oxide layer 116B, an electrically conductive gate layer 118B and a second oxide layer 120B. Similarly, MOSFET 182 includes a gate structure 119C comprising a gate oxide layer 116C, a conductive gate layer 118C and a second oxide layer 120C. Formed adjacent side 134B, 136B of gate structure 119B are sidewall spacers 122B, 124B, respectively. Similarly formed adjacent sides 134C, 136C of gate structure 119C are sidewall spacers 122C, 124C, respectively.

MOSFETs 180, 182 further include electrically conductive raised source/drain regions 196, 198, respectively. As shown in FIG. 13, raised source/drain regions 196, 198 (i.e. electrically conductive structures) are formed overlying substrate principal surface 117 and extend laterally from sidewall spacers 122B, 124C to positions overlying field oxide regions 114A, 114B, respectively. Raised source/drain regions 196, 198 have first portions on portions of field oxide regions 114A, 114B, second portions on portions of sidewall spacers 122B, 124C and third portions on portions of substrate principal surface 117, respectively. Raised source/drain regions 196, 198, and the portions thereof, are all of a substantially uniform thickness $T_P$.

MOSFETs 180, 182 share an electrically conductive raised source/drain region 200. Raised source/drain region 200 (i.e. an electrically conductive structure) is formed overlying substrate principal surface 117 and extends laterally between sidewall spacers 124B and 122C. Raised source/drain region 200 has a first portion on a portion of sidewall spacer 124B, a second portion on a portion of substrate principal surface 117 and a third portion on a portion of sidewall spacer 122C. Raised source/drain region 200, and the portions thereof, are all of a substantially uniform thickness $T_P$.

Formed in substrate 110, and in particular in N-well 112, are shallow (in terms of depth) and lightly doped P− source/drain junctions 190, 192, 194 (i.e. the source/drain regions, hereinafter P− junctions 190, 192, 194, respectively). Illustratively, P− junctions 190, 192, 194 have dopant concentrations in the range of $1\times10^{17}$ atoms/cm$^3$ to $1\times10^{19}$ atoms/cm$^3$ and depths (from substrate principal surface 117) in the range of 0.05 μm to 0.3 μm. As shown in FIG. 13, P− junctions 190, 192 are laterally-aligned with sides 134B, 136C of gate structure 119B, 119C and laterally extend to field oxide region 114A, 114B, respectively. Further, P− junction 194 is laterally-aligned with sides 136B, 134C of gate structures 119B, 119C, respectively.

Formed within substrate 110, and more particularly within P− junctions 190, 192, are shallow and heavily doped P+ source/drain junctions 184, 186 (i.e. source/drain contact regions, hereinafter P+ junctions 184, 186), respectively. P+ junctions 184, 186 are laterally-aligned with sidewall spacers 122B, 124C and laterally extend to field oxide regions 114A, 114B, respectively. Formed within P− junction 194 is a shallow and heavily doped P+ source/drain junction 188 (i.e. a source/drain contact region, hereinafter P+ junction 188) laterally-aligned with sidewall spacers 124B and 122C. Illustratively, P+ junctions 184, 186, 188 have dopant concentrations in the range of $1\times10^{19}$ atoms/cm$^3$ to $1\times10^{21}$ atoms/cm$^3$ and depths (from substrate principal surface 117) in the range of 0.01 μm to 0.2 μm.

Raised source/drain regions 196, 198, 200 are in physical and electrically contact with P+ junctions 184, 186, 188, respectively. Raised source/drain regions 196, 198, 200 are in electrical contact (via P+ junctions 184, 186, 188) with P– junctions 190, 192, 194, respectively. Thus, raised source/drain region 196, P+ junction 184 and P– junction 190 collectively are referred to as a first source/drain of MOSFET 180. Similarly, raised source/drain region 198, P+ junction 186 and P– junction 192 collectively are referred to as a first source/drain of MOSFET 182. MOSFETs 180, 182 share raised source/drain region 200, P+ junction 188 and P– junction 194 collectively referred to as a second source/drain of MOSFETs 180, 182.

Forming shallow P– junctions 190, 192 and 194 and shallow P+ junctions 184, 186 and 188 advantageously suppresses the drain depletion layer which extends between the respective source and drain junctions. This allows widths $W_{GB}$, $W_{GC}$ of gate structures 119B, 119C, i.e. the distances between sides 134B, 136B and 134C, 136C, respectively, to be reduced compared to the prior art. Accordingly, the surface area of substrate 110 occupied by MOSFETs 180, 182 is reduced allowing higher density devices to be fabricated. Forming shallow P– junctions 190, 192 and 194 and shallow P+ junctions 184, 186 and 188 also substantially eliminates the effect on threshold voltage of the source/drain voltage compared to the prior art.

By sharing a source/drain, MOSFETs 180, 182 also occupy less surface area on substrate 110 compared to a conventional MOSFET pair in which each MOSFET has its own separate source and drain. In particular, since MOSFETs 180, 182 share raised source/drain region 200, P+ junction 188 and P– junction 194, MOSFETs 180, 182 are formed with one less source/drain (with three source/drains) compared to a conventional MOSFET pair with four source/drains. Since each source/drain occupies a certain surface area on a substrate, the surface area occupied by MOSFETs 180, 182 is reduced at least by the surface area of one source/drain. Thus, in accordance with the present invention, more MOSFETs per unit substrate area can be fabricated compared to the prior art.

Referring to FIG. 13, to form MOSFETs 180, 182, N-well 112 is formed in substrate 110. Field oxide regions 114A, 114B are formed at substrate principal surface 117 and planarized to form upper surfaces 115A, 115B, respectively. In accordance with this embodiment, two gate structures 119B, 119C are formed.

The entire structure is then subjected to a P type impurity implantation (similar to the P type impurity implantation illustrated in FIG. 3) to form P– junctions 190, 192 and 194 (FIG. 13) in N-well 112. Since the P type impurity does not pass through gate structures 119B, 119C or field oxide regions 114A, 114B and into the underlying portions of substrate 110, P– junctions 190, 192 are self-aligned (laterally-aligned) to sides 134B, 136C of gate structures 119B, 119C and laterally extend to field oxide region 114A, 114B, respectively. For the same reason, P– junction 194 is laterally-aligned (self-aligned) to sides 136B, 134C of gate structures 119B, 119C, respectively.

Figure 14:
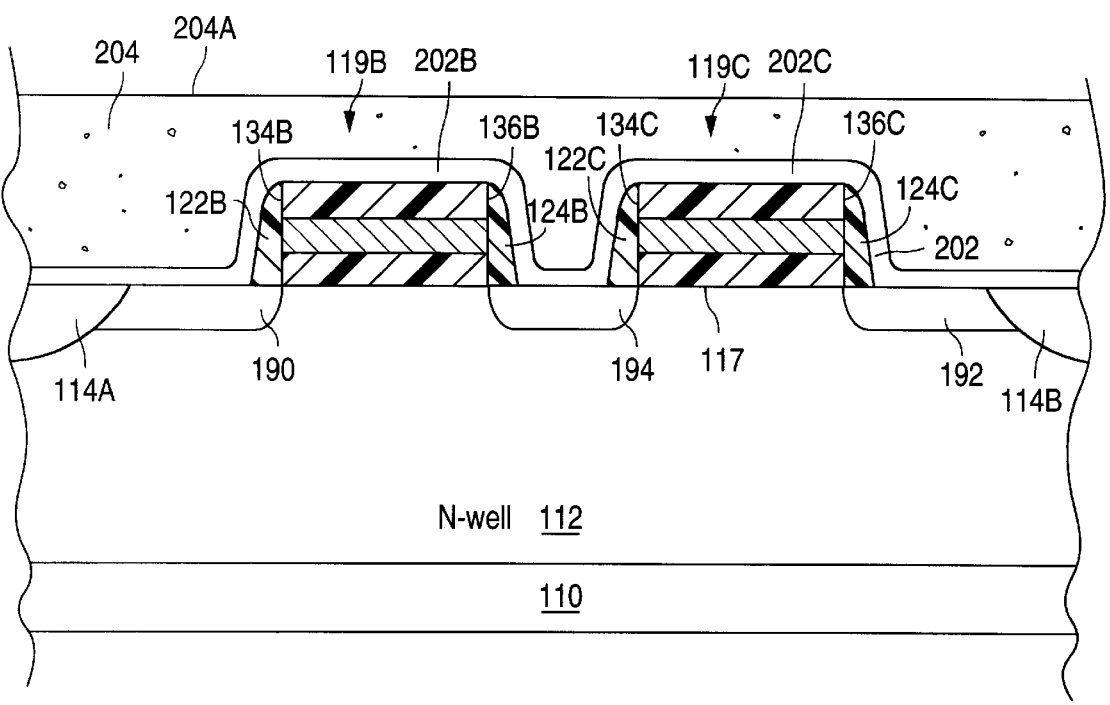
FIGS. 14, 15 and 16 are cross-sectional views of the MOSFET pair of FIG. 13 at various stages during fabrication in accordance with one embodiment of the present invention.

Referring now to FIG. 14, a cross-sectional view of the MOSFETs of FIG. 13 during processing in accordance with this embodiment of the present invention, sidewall spacers 122B, 124B, and 122C, 124C are formed adjacent sides 134B, 136B and 134C, 136C of gate structures 119B, 119C, respectively. After sidewall spacers 122B, 124B, 122C, 124C are formed, a layer 202, e.g. polysilicon, is formed overlying the entire structure. Polysilicon layer 202 is substantially similar to polysilicon layer 148 of FIGS. 4A, 4B. As shown in FIG. 14, polysilicon layer 202 follows the topography of the underlying structure. In particular, polysilicon layer 202 has a raised first portion 202B overlying gate structure 119B (and sidewall spacers 122B, 124B) and a raised second portion 202C overlying gate structure 119C (and sidewall spacers 122C, 124C). After polysilicon layer 202 is formed, a masking layer 204 (similar to masking layer 150 in FIG. 4A or masking layer 152 in FIG. 4B after planarization) is formed overlying the entire structure. Generally, it is desirable to have a masking layer 204 which can be preferentially etched compared to polysilicon layer 202. As shown in FIG. 14, masking layer 204 has a substantially planar surface 204A which is substantially parallel to the plane defined by substrate principal surface 117.

Figure 15:
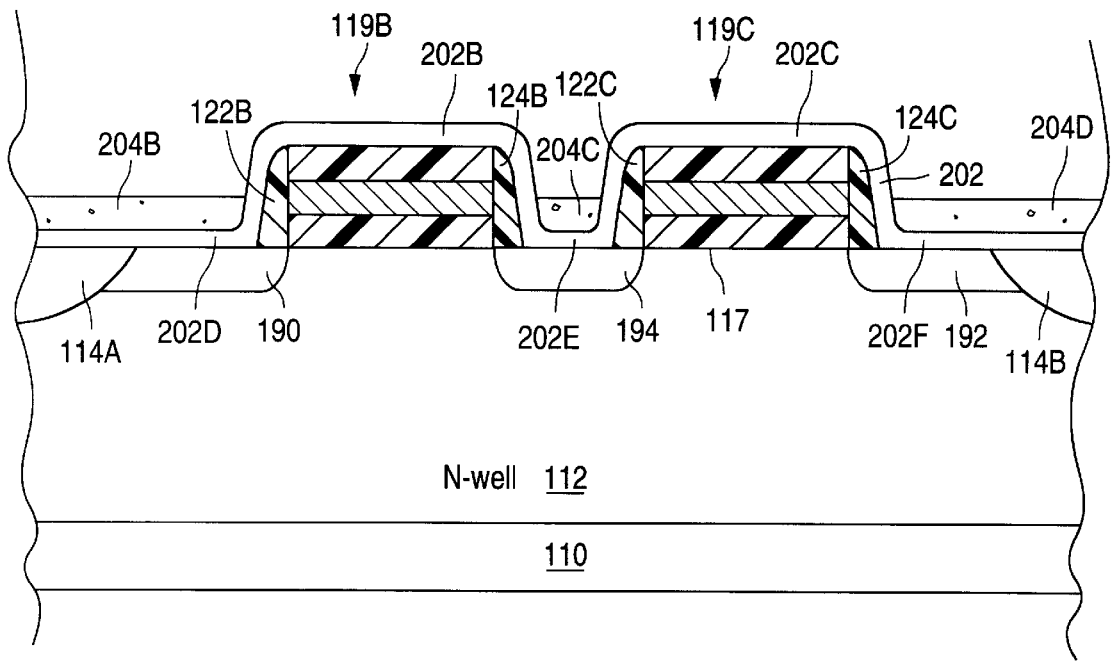

Referring now to FIG. 15, masking layer 204 is blanket etched to form first, second and third portions 204B, 204C and 204D of masking layer 204. As shown in FIG. 15, after the blanket etch of masking layer 204, raised first portion 202B and raised second portion 202C of polysilicon layer 202 are exposed, i.e. are unprotected by the remaining first, second and third portions 204B, 204C and 204D of masking layer 204.

Figure 16:
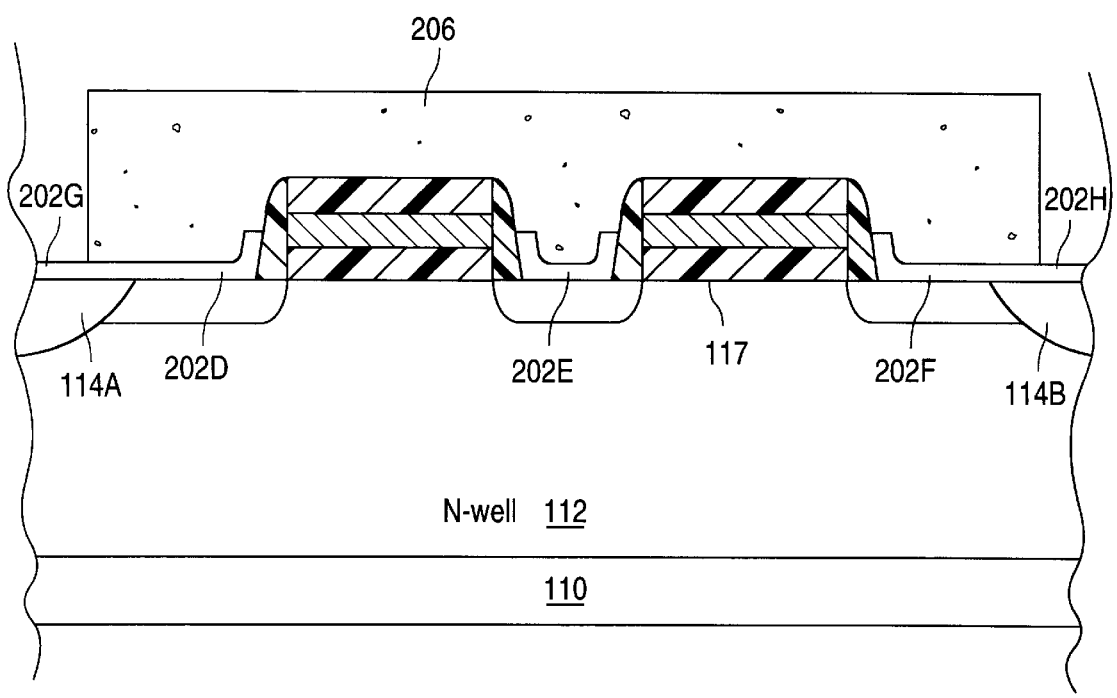

Referring now to FIG. 16, first and second portions 202B, 202C of layer 202 are removed using first, second and third portions 204B, 204C, 204D (FIG. 15) of masking layer 204 as a mask. After first and second raised portions 202B, 202C of layer 202 are removed, portions 202D, 202E, and 202F (which underlie first, second, and third portions 204B, 204C, 204D of masking layer 204, respectively) of polysilicon layer 202 remain. First, second and third portions 204B, 204C and 204D of masking layer 204 are then removed. A suitable material, e.g. photoresist, is applied over the entire structure and patterned to form a mask 206 as shown in FIG. 16. Mask 206 leaves exposed sections 202G, 202H of portions 202D, 202F, respectively, over field oxide regions 114A, 114B, respectively. The exposed sections 202G, 202H are then removed. The remaining sections of portions 202D, 202F define raised source/drain regions 196, 198 (FIG. 13), respectively. Portion 202E defines raised source/drain region 200 (FIG. 13). Mask 206 is then removed.

The P type impurity implantation which dopes polysilicon layer 202 (or portions/sections thereof) to have P type conductivity and the formation of P+ junctions 184, 186, 188 are not illustrated in FIGS. 14, 15 or 16. In accordance with alternative embodiments of the present invention, the P type impurity implantation similar to that illustrated in FIG. 7 is performed at various stages after layer 202 is formed. Referring first to FIG. 14, in one of these embodiments the P type impurity implantation is performed after polysilicon layer 202 is formed and before masking layer 204 is formed. In an alternative embodiment, referring to FIG. 15, the P type impurity implantation is performed after portions 204B, 204C, 204D of masking layer 204 are removed. In another one of these embodiments, referring to FIG. 16, the P type impurity implantation is performed after mask 206 is removed.

In an alternative embodiment, a separate P type impurity implantation (similar to that illustrated in FIG. 3) to form P– junctions 190, 192 and 194 is not performed. In accordance with this embodiment, the thickness of polysilicon layer 202, and also the width of sidewall spacers 122B, 124B, 122C, and 124C are of increased importance for reasons similar to those described above in relation to thickness $T_P$ and width $W_S$ (FIG. 2).

Referring to FIG. 13, a thermal cycle is performed after the P type impurities are implanted into polysilicon layer 202 (or portions/section of polysilicon layer 202) to form P+ junctions 184, 186, 188 (and P– junctions 190, 192, 194 depending upon the embodiment).

Referring to FIGS. 14 and 15, first and second portions 202B, 202C of polysilicon layer 202 are removed without using complex photolithographic techniques, i.e. without using photolithography to pattern a masking layer. This allows gate structures 119D, 119C to be patterned at the critical dimension. Further, referring to FIG. 16, there is great flexibility in the placement of mask 206 and no additional substrate area is necessary to accommodate tolerance associated with the placement of mask 206. This enables further reduction in the feature size of a MOSFET in accordance with the present invention compared to the prior art.

Figure 17:
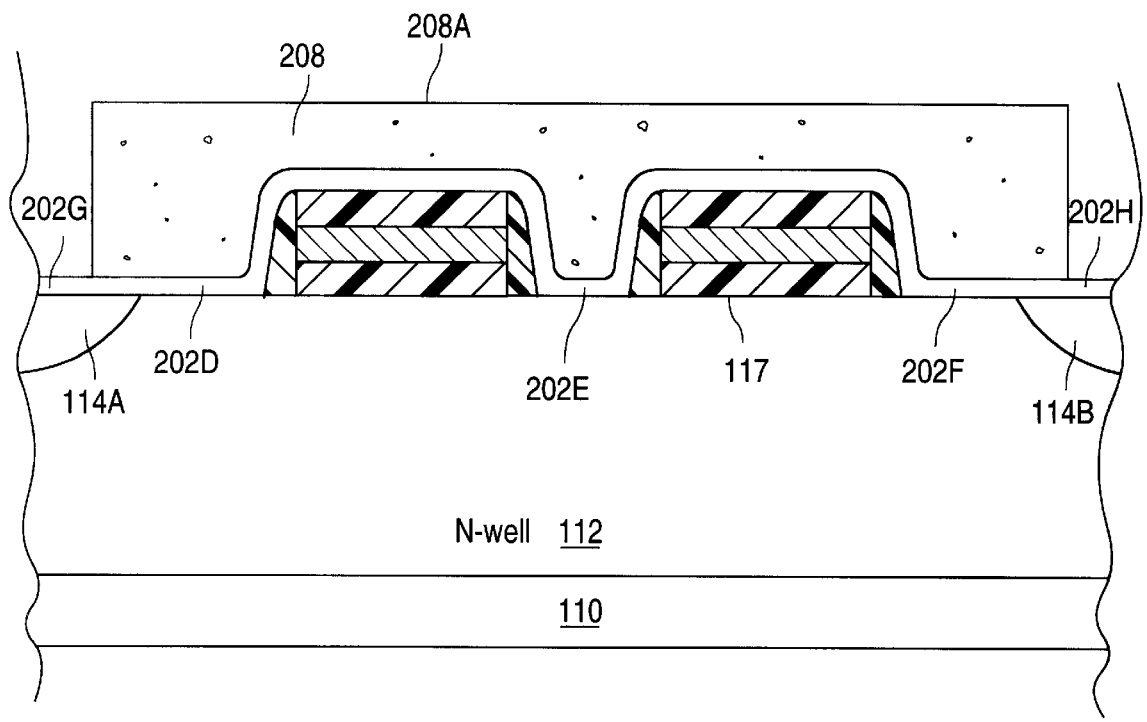
FIGS. 17 and 18 are cross-sectional views of the MOSFET pair of FIG. 13 at various stages during fabrication in accordance with an alternative embodiment of the present invention.

FIG. 17 is a cross-sectional view of the MOSFETs of FIG. 13 during fabrication in accordance with an alternative embodiment of the present invention which uses one less masking step compared to the embodiment illustrated in FIGS. 14, 15 and 16. After masking layer 204 is formed as illustrated in FIG. 14, masking layer 204 is patterned to form a mask 208 shown in FIG. 17. Mask 208 leaves exposed section 202G, 202H of portions 202D, 202F, respectively, and has a substantially planar surface 208A which is substantially parallel to the plane defined by substrate principal surface 117.

Figure 18:
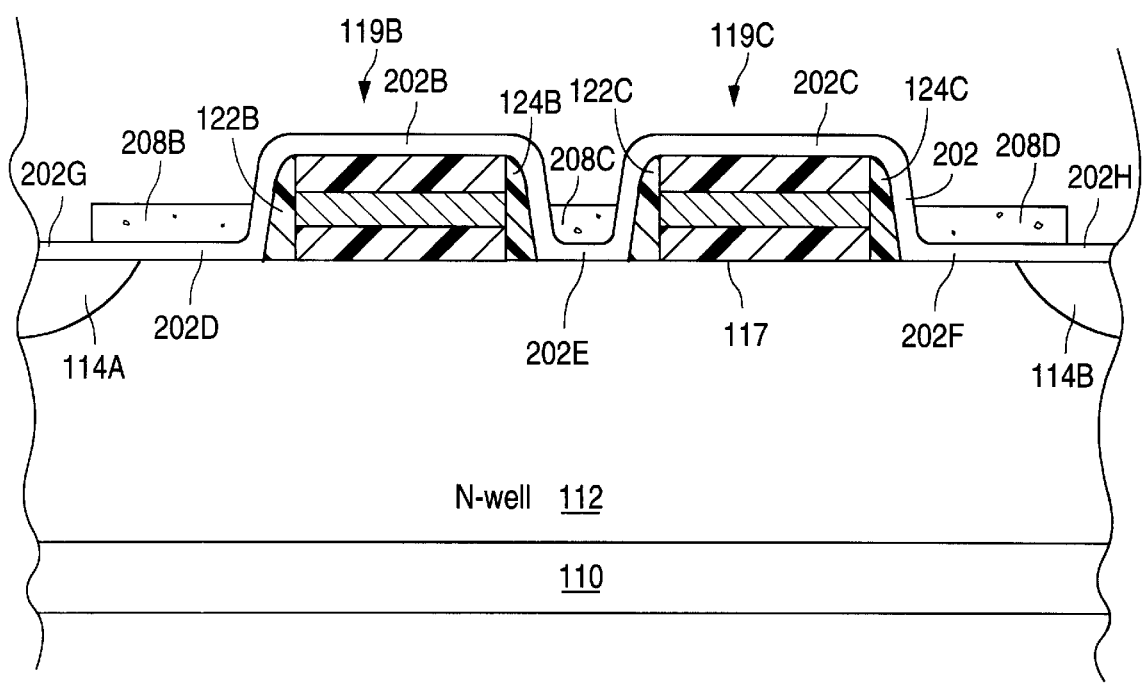

Referring to FIG. 18, mask 208 is blanket etched to form first, second and third portions 208B, 208C and 208D of mask 208. As shown in FIG. 18, after the blanket etch of mask 208, first and second portions 202B, 202C and sections 202G, 202H are exposed, i.e. are unprotected by the remaining first, second and third portions 208B, 208C and 208D of mask 208.

First and second portions 202B, 202C and sections 202G, 202H are then removed using first, second and third portions 208B, 208C and 208D of mask 208 as a mask. After first and second portions 202B, 202C and sections 202G, 202H are removed, raised source/drain regions 196, 198, 200 (FIG. 13) which underlie first, third and second portions 208B, 208D, 208C of mask 208, respectively, remain. Portions 208B, 208C and 208D of mask 208 are then removed.

For simplicity, the various P type impurity implantations and thermal cycles used to form P– junctions 190, 192, 194 and P+ junctions 184, 186, 188 (FIG. 13) and to dope raised source/drain regions 196, 198, 200 to have P type conductivity are not described in this embodiment. However, those skilled in the art will understand that P type impurity implantations and thermal cycles similar to those described above are performed in this embodiment.

Figure 19:
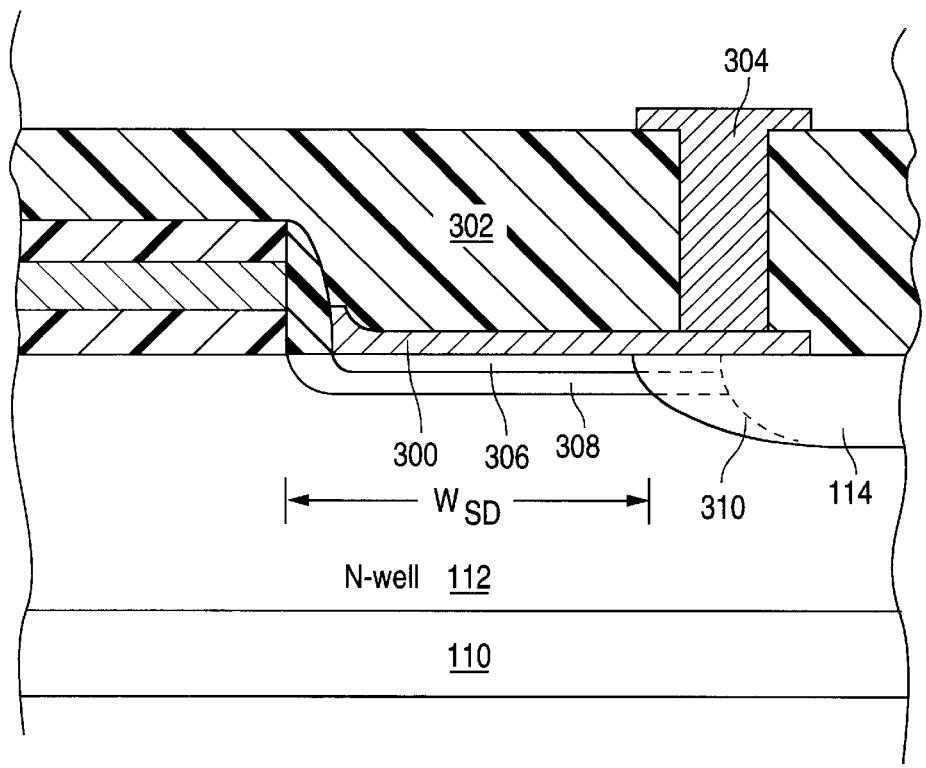
FIG. 19 is a cross-sectional view of a source/drain contact in accordance with the present invention.

FIG. 19 is a cross-sectional view of a source/drain contact in accordance with the present invention. As shown in FIG. 19, a portion of a raised source/drain region 300 (an electrically conductive structure) extends over planarized field oxide region 114. Raised source/drain region 300 is fabricated in accordance with the embodiments described above and is substantially similar to raised source/drain regions 126, 128 (FIG. 2) and raised source/drain regions 196, 198 (FIG. 13). An electrically insulating layer 302 is formed over the entire structure. An aperture is formed in insulating layer 302 and an electrically conductive source/drain contact 304 is formed in this aperture. As shown in FIG. 19, source/drain contact 304 extends through insulating layer 302 and is in electrical and physical contact with raised source/drain region 300.

Of importance, source/drain contact 304 is formed above field oxide region 114. This allows the substrate surface area occupied by field oxide region 114 to be utilized for source/drain contact 304. Alternatively, source/drain contact 304 can have a first portion over field oxide region 114 and a second portion over source/drain junctions 306, 308. (In this alternative, field oxide region 114 is indicated by the dashed line 310.) In contrast, conventional MOSFETs in which the source/drains are formed entirely within the substrate require the source/drain contact to be formed over the active region of the semiconductor device. More particularly, in conventional MOSFETs, the source/drain contact is formed between the sidewall spacer and the field oxide region.

Forming source/drain contact 304 (or a portion of source/drain contact 304) over field oxide region 114 advantageously increases the substrate surface area available to form source/drain contact 304. This allows the width $W_{SD}$ of source/drain junctions 306, 308 in substrate 110 to be reduced. Illustratively, width $W_{SD}$ is reduced from 1.5 μm in the prior art to 0.5 μm in accordance with the present invention for 0.5 μm technology. This allows further reduction in the substrate surface area occupied by a MOSFET in accordance with the present invention compared to the prior art.

In the above embodiments, the fabrication of MOSFETs having P type source/drains (PMOS transistors) and the resulting structures are described. It is understood that the conductivity type of the implanted impurities and semiconductor regions can be reversed to form MOSFETs having N type source/drains (NMOS transistors). For example, N-well 112 can be a P-well. The P type impurity implantation illustrated in FIG. 3 can be performed with an N type impurity, for example can be arsenic implanted with an implant energy in the range of 10 kev to 100 kev or greater and an implant dosage in the range of $1\times10^{12}$ atoms/cm$^2$ to $1\times10^{14}$ atoms/cm$^2$. Further, the P type impurity implantation illustrated in FIG. 7 can be performed with an N type impurity, for example can be arsenic implanted with an implant energy of 60 kev to 80 kev and an implant dosage of $5\times10^{15}$ atoms/cm$^2$. Further, it is understood that a PMOS transistor and an NMOS transistor in accordance with the present invention can be formed during the same process in the same substrate, for example to form a complementary metal oxide silicon (CMOS) device.

Figure 20:
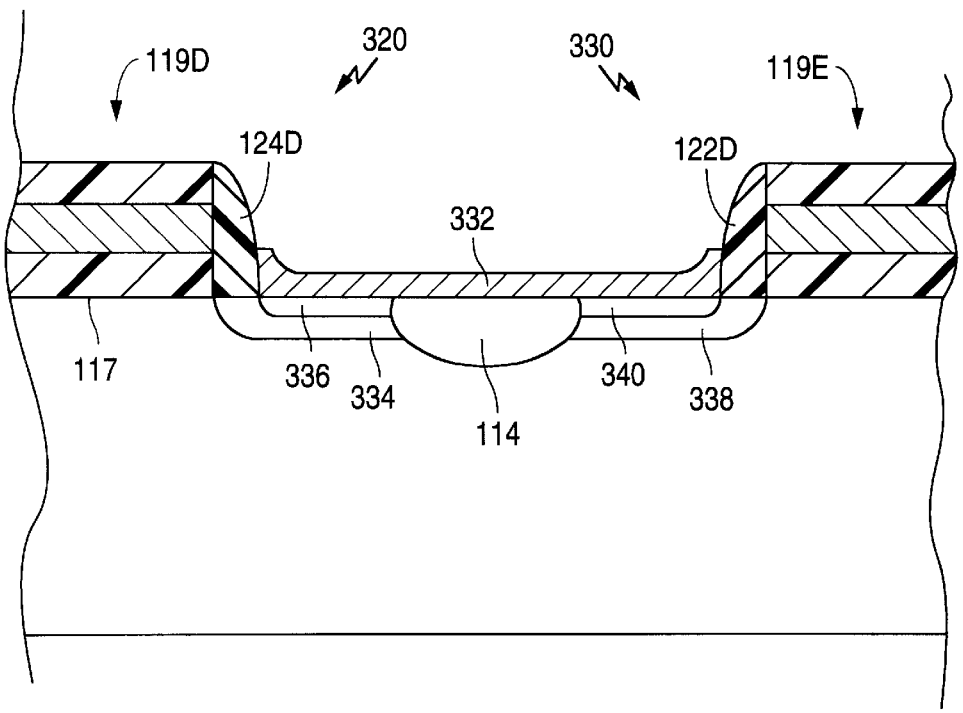
FIG. 20 is a cross-sectional view of a pair of MOSFETs having a local interconnect therebetween in accordance with an alternative embodiment of the present invention.

FIG. 20 is a cross-sectional view of a MOSFET 320 adjacent a MOSFET 330 having a local interconnect therebetween in accordance with an alternative embodiment of the present invention. MOSFETs 320, 330 include sidewall spacers 124D, 122D adjacent gate structure 119D, 119E, respectively. Overlying substrate principal surface 117 and planarized field oxide region 114 is an electrically conductive raised source/drain region 332 (i.e. an electrically conductive structure) extending from sidewall spacer 124D to sidewall spacer 122D. Raised source/drain region 332 electrically connects P– source/drain junction 334 and P+ source/drain junction 336 of MOSFET 320 to P– source/drain junction 338 and P+ source/drain junction 340 of MOSFET 330, i.e. is a local interconnect between MOSFET 320 and MOSFET 330.

Raised source/drain region 332 can be fabricated by modifying source/drain mask 161 (FIG. 8), mask 174 (FIG. 11), mask 206 (FIG. 16) or mask 208 (FIG. 17) to extend to an adjacent MOSFET (not shown in FIGS. 8, 11, 16 or 17). Although MOSFETs 320, 330 are described as PMOS transistors, in alternative embodiments raised source/drain region 332 forms a local interconnection between NMOS transistors or between a PMOS transistor and an NMOS transistor. Having thus described the principles in the invention, together with several illustrative embodiments thereof, it is to be understood that, although specific terms are employed, they are used in a generic and descriptive sense, and not for the purpose of limitation, the scope of the invention being set forth in the following claims.

We claim:

1. A method of forming a semiconductor device comprising the following steps:
   providing a semiconductor substrate having a surface, a planarized field oxide region at said surface and a gate structure overlying said surface;
   forming a sidewall spacer adjacent to said gate structure;
   forming a layer overlying said substrate, said layer having a raised portion overlying said gate structure;
   forming a masking layer overlying said layer, said masking layer having a substantially planar exposed surface;
   blanket etching said masking layer to expose said raised portion of said layer, said masking layer having a remaining portion disposed on said layer;
   selectively removing said raised portion of said layer using said remaining portion of said masking layer;
   removing said remaining portion of said masking layer; and
   implanting impurities having a first conductivity type into a remaining portion of said layer.

2. The method of claim 1 further comprising the step of diffusing said impurities into said substrate to form a first semiconductor region, said first semiconductor region being laterally-aligned with a side of said gate structure and laterally extending to said field oxide region.

3. The method of claim 2 wherein, during said step of diffusing, said impurities diffuse into said substrate to form a second semiconductor region in said first semiconductor region, said second semiconductor region being laterally-aligned with said sidewall spacer and laterally extending to said field oxide region, said second semiconductor region having a higher dopant concentration than said first semiconductor region.

4. The method of claim 3 wherein said first semiconductor region and said second semiconductor region are formed in a third semiconductor region having a second conductivity type opposite said first conductivity type.

5. The method of claim 1 wherein said first conductivity type is P type.

6. The method of claim 1 further comprising, before said step of forming a sidewall spacer, the step of implanting impurities having said first conductivity type into said substrate to form a first semiconductor region, said first semiconductor region being laterally-aligned with a side of said gate structure and laterally extending to said field oxide region.

7. The method of claim 6 further comprising the step of diffusing said impurities from said remaining portion of said layer into said substrate to form a second semiconductor region in said first semiconductor region, said second semiconductor region being laterally-aligned with said sidewall spacer and laterally extending to said field oxide region, said second semiconductor region having a higher dopant concentration than said first semiconductor region.

8. The method of claim 7 wherein said first semiconductor region and said second semiconductor region are formed in a third semiconductor region having a second conductivity type opposite said first conductivity type.

9. The method of claim 1 further comprising the steps of:
   forming an insulating layer overlying said substrate;
   forming a first aperture and a second aperture in said insulating layer; and
   forming a source/drain contact in said first aperture and a gate contact in said second aperture.

10. The method of claim 9 wherein said source/drain contact is formed above said field oxide region.

11. The method of claim 1 wherein said layer comprises polysilicon.

12. The method of claim 1 wherein said layer comprises polycide.

13. The method of claim 1 wherein a remaining portion of said layer extends from said sidewall spacer over said field oxide region to a sidewall spacer of an adjacent device.

14. The method of claim 1 wherein said step of selectively removing further comprises selectively removing a first section of said layer above said field oxide region.

15. The method of claim 13 further comprising the step of diffusing impurities having a first conductivity type from a second section of said layer into said substrate to form at least one semiconductor region.

16. The method of claim 15 further comprising, before said step of forming a sidewall spacer, the step of implanting impurities having said first conductivity type into said substrate to form a first semiconductor region, said at least one semiconductor region being formed in said first semiconductor region.

17. A method of forming a semiconductor device comprising the following steps:
   providing a semiconductor substrate having a surface, a planarized first field oxide region and a planarized second field oxide region at said surface and a first gate structure and a second gate structure overlying said surface;
   forming sidewall spacers adjacent to sides of said first gate structure and said second gate structure;
   forming a layer overlying said substrate, said layer having a raised first portion overlying said first gate structure and a raised second portion overlying said second gate structure;
   forming a masking layer overlying said layer, said masking layer having a substantially planar exposed surface;
   blanket etching said masking layer to expose said raised first portion and said raised second portion of said layer, said masking layer having remaining portions disposed on said layer;
   selectively removing said raised first portion and said raised second portion of said layer using said remaining portions of said masking layer;
   removing said remaining portions of said masking layer, wherein said step of selectively removing defines a third portion, a fourth portion and a fifth portion of said layer;
   selectively removing a first section of said third portion and a first section of said fourth portion, a remaining second section of said third portion is a first electrically conductive structure, a remaining second section of said fourth portion is a second electrically conductive structure and said fifth portion is a third electrically conductive structure; and
   implanting impurities having a first conductive type into said second section of said third portion, into said second section of said fourth portion and into said fifth portion.

18. The method of claim 17 further comprising the step of diffusing said impurities into said substrate to form a first semiconductor region, a second semiconductor region and a third semiconductor region.

19. The method of claim 18 wherein said step of diffusing further forms a fourth semiconductor region in said first semiconductor region, a fifth semiconductor region in said second semiconductor region and a sixth semiconductor region in said third semiconductor region.

20. The method of claim 18 further comprising, before said step of forming sidewall spacers, the step of implanting impurities having said first conductivity type into said substrate to form a fourth semiconductor region, a fifth semiconductor region and a sixth semiconductor region.

21. The method claim 17 further comprising the step of forming an electrically conductive source/drain contact electrically connected to said first electrically conductive structure, said source/drain contact being above said first field oxide region.

22. The method of claim 3 further comprising the step of removing a first section of said layer above said field oxide region prior to said step of implanting impurities.

23. The method of claim 3 further comprising the step of removing a first section of said layer above said field oxide region subsequent to said step of implanting impurities.

24. The method of claim 7 further comprising the step of removing a first section of said layer above said field oxide region prior to said step of implanting impurities.

25. The method of claim 7 further comprising the step of removing a first section of said layer above said field oxide region subsequent to said step of implanting impurities.

26. A method of forming a semiconductor device comprising the following steps:
    providing a semiconductor substrate having a surface, a planarized field oxide region at said surface and a gate structure overlying said surface;
    forming a sidewall spacer adjacent to said gate structure;
    forming a layer overlying said substrate, said layer having a raised portion overlying said gate structure;
    forming a masking layer overlying said layer, said masking layer having a substantially planar exposed surface;
    blanket etching said masking layer to expose said raised portion of said layer, said masking layer having a remaining portion disposed on said layer;
    selectively removing said raised portion of said layer using said remaining portion of said masking layer;
    removing said remaining portion of said masking layer; and
    implanting impurities having a first conductivity type into said layer wherein said impurities are implanted prior to said step of forming said masking layer.

27. The method of claim 26 further comprising the step of diffusing said impurities into said semiconductor substrate to form a first semiconductor region.

28. The method of claim 27, wherein during said step of diffusing, said impurities diffuse into said semiconductor substrate to form a second semiconductor region in said first semiconductor region, said second semiconductor region having a higher dopant concentration than said first semiconductor region.

29. The method of claim 28 further comprising the step of removing a first section of said layer above said field oxide region subsequent to said step of selectively removing said raised portion of said layer.

30. The method of claim 28 wherein said masking layer does not cover a first section of said layer above said field oxide region and wherein said first section of said layer is removed during said step of selectively removing said raised portion of said layer.

31. The method of claim 26 further comprising, prior to said step of forming said sidewall spacer, the step of implanting impurities having said first conductivity type into said semiconductor substrate to form a first semiconductor region.

32. The method of claim 31 further comprising the step of diffusing said impurities from said layer into said semiconductor substrate to form a second semiconductor region, said second semiconductor region having a higher dopant concentration than said first semiconductor region.

33. The method of claim 32 further comprising the step of removing a first section of said layer above said field oxide region subsequent to said step of selectively removing said raised portion of said layer.

34. The method of claim 32 wherein said masking layer does not cover a first section of said layer above said field oxide region, wherein said first section of said layer is removed during said step of selectively removing said raised portion of said layer.

35. The method of claim 14, wherein during said step of diffusing impurities, said impurities diffuse into said semiconductor substrate to form a first semiconductor region, said at least one semiconductor region being formed in said first semiconductor region.

36. A method of forming a semiconductor device comprising:
    providing a semiconductor substrate having a surface, a first and a second field oxide region supported by said semiconductor substrate, said first and second field oxide regions having a surface lying on a plane defined by said surface of said semiconductor substrate, and a first and a second gate structure supported by said semiconductor substrate;
    forming sidewall spacers adjacent to sides of said first and second gate structures;
    forming a first doped region in said semiconductor substrate;
    forming a second doped region in said semiconductor substrate, said second doped region having a higher dopant concentration than said first doped region; and
    forming an electrically conductive layer overlying said semiconductor substrate, said electrically conductive layer being defined by a first electrically conductive layer extending from said first gate structure to said first field oxide region, a second electrically conductive layer extending from said second gate structure to said second field oxide region, and a third electrically conductive layer continuously extending from said first gate structure to said second gate structure;
    wherein forming said electrically conductive layer comprises forming a layer on said semiconductor substrate, said sidewall spacers and said first and second gate structures, said layer having raised portions on said first and second gate structures, implanting impurities in said layer, and removing said raised portions of said layer; and
    wherein removing said raised portions comprises forming a masking layer on said layer, said masking layer having a substantially planar exposed surface, blanket etching said masking layer to expose said raised portions, said masking layer having remaining portions disposed on said layer, selectively removing said raised portions using said remaining portions of said masking layer, and removing said remaining portions of said masking layer.

37. The method of claim 36, wherein said sidewall spacers are formed subsequent to said forming a first doped region.

38. The method of claim 36, wherein said sidewall spacers are formed prior to said forming a first doped region.

39. The method of claim 36, wherein said impurities are implanted prior to removing said raised portions.

40. The method of claim 36, wherein said impurities are implanted subsequent to removing said raised portions.

41. The method of claim 36, further comprising removing a portion of said layer over said first field oxide region and said second field oxide region contemporaneously with removing said raised portions.

42. The method of claim 41, wherein removing said raised portions and said portion of said layer over said first and second field oxide regions comprises forming said masking layer on said layer such that said masking layer does not cover a selected portion of said layer over said first and second field oxide regions; blanket etching said masking layer to expose said raised portions of said layer, said masking layer having said remaining portions disposed on said layer; selectively removing said raised portions and said portion of said layer over said first and second field oxide regions using said remaining portions of said masking layer; and removing said remaining portions of said masking layer.

43. A method of forming a semiconductor device comprising:

providing a semiconductor substrate having a surface, a first and a second field oxide region supported by said semiconductor substrate, said first and second field oxide regions having a surface lying on a plane defined by said surface of said semiconductor substrate, and a first and a second gate structure supported by said semiconductor substrate:

forming sidewall spacers adjacent to sides of said first and second gate structures;

forming a first doped region in said semiconductor substrate:

forming a second doped region in said semiconductor substrate, said second doped region having a higher dopant concentration than said first doped region; and forming an electrically conductive layer overlying said semiconductor substrate, said electrically conductive layer being defined by a first electrically conductive layer extending from said first gate structure to said first field oxide region, a second electrically conductive layer extending from said second gate to said second field oxide region, and a third electrically conductive layer continuously extending from said first gate structure to said second gate structure, wherein forming said electrically conductive layer comprises forming a layer on said semiconductor substrate, said sidewall spacers and said first and second gate structures, said layer having raised portions on said first and second gate structures, implanting impurities in said layer, and removing said raised portions of said layer;

removing a portion of said layer over said first field oxide region and said second field oxide region contemporaneously with removing said raised portions, wherein said impurities are implanted prior to said removing said raised portions and said portion of said layer over said first and second field oxide regions.

44. The method of claim 41, wherein said impurities are implanted subsequent to removing said raised portions and said portion of said layer over said first and second field oxide regions.

45. The method of claim 41, wherein said forming a first doped region and said forming a second doped region comprises diffusing said impurities into said semiconductor substrate.

46. The method of claim 41, wherein said forming a second doped region comprises diffusing said impurities into said semiconductor substrate, said second doped region being diffused in said first doped region, wherein said first doped region is implanted in said semiconductor substrate prior to said forming sidewall spacers.

47. The method of claim 36, further comprising removing a portion of said layer over said first field oxide region and said second field oxide region subsequent to removing said raised portions.

48. The method of claim 47, wherein said forming a first doped region and said forming a second doped region comprise diffusing said impurities into said semiconductor substrate prior to said removing a portion of said layer over said first and said second field oxide regions.

49. The method of claim 47, wherein said forming a first doped region and said forming a second doped region comprise diffusing said impurities into said semiconductor substrate subsequent to said removing a portion of said layer over said first and said second field oxide regions.

50. The method of claim 47, wherein said forming a second doped region comprises diffusing said impurities into said semiconductor substrate prior to said removing a portion of said layer over said first and second field oxide regions, said second doped region being diffused in said first doped region, wherein said first doped region is implanted in said semiconductor substrate prior to said forming sidewall spacers.

51. The method of claim 47, wherein said forming a second doped region comprises diffusing said impurities into said semiconductor substrate subsequent to said removing a portion of said layer over said first and second field oxide regions, said second doped region being diffused in said first doped region, wherein said first doped region is implanted in said semiconductor substrate prior to said forming sidewall spacers.

52. The method of claim 47, wherein said impurities are implanted prior to removing said raised portions.

53. The method of claim 47, wherein said impurities are implanted subsequent to removing said raised portions and prior to removing said portion over said first and second field oxide regions.

54. The method of claim 47, wherein said impurities are implanted subsequent to removing said portion over said first and second field oxide regions.

55. The method of claim 36, wherein said forming a first doped region and said forming a second doped region comprise diffusing said impurities into said semiconductor substrate.

56. The method of claim 36, wherein said forming a second doped region comprises diffusing said impurities into said semiconductor substrate, said second doped region being diffused in said first doped region, wherein said first doped region is implanted in said semiconductor substrate prior to said forming sidewall spacers.

57. A method of forming a semiconductor device comprising the following steps:

providing a semiconductor substrate having a surface, a planarized first field oxide region and a planarized second field oxide region at said surface and a first gate structure and a second gate structure overlying said surface;

forming sidewall spacers adjacent to sides of said first gate structure and said second gate structure;

forming a layer overlying said substrate, said layer having a raised first portion overlying said first gate structure and a raised second portion overlying said second gate structure;

forming a masking layer overlying said layer, said masking layer having a substantially planar exposed surface;

blanket etching said masking layer to expose said raised first portion and said raised second portion of said layer, said masking layer having remaining portions disposed on said layer;

selectively removing said raised first portion and said raised second portion of said layer using said remaining portions of said masking layer; and removing said remaining portions of said masking layer, wherein impurities having a first conductivity type are implanted into said layer prior to said step of forming said masking layer.

* * * * *